United States Patent
Hinata et al.

(10) Patent No.: US 12,075,652 B2
(45) Date of Patent: Aug. 27, 2024

(54) LIGHT-EMITTING DEVICE, DISPLAY DEVICE, IMAGING DEVICE, AND ELECTRONIC DEVICE, WITH SUBSTRATE, LENS INCLUDING CONVEX CURVED SURFACE PORTION, AND LIGHT-EMITTING PART BETWEEN SURFACE OF SUBSTRATE AND LENS

(71) Applicant: CANON KABUSHIKI KAISHA, Tokyo (JP)

(72) Inventors: Shoma Hinata, Kanagawa (JP); Hiroaki Sano, Kanagawa (JP); Koji Ishizuya, Kanagawa (JP); Yojiro Matsuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 434 days.

(21) Appl. No.: 17/495,947

(22) Filed: Oct. 7, 2021

(65) Prior Publication Data
US 2022/0131112 A1   Apr. 28, 2022

(30) Foreign Application Priority Data
Oct. 28, 2020 (JP) .................. 2020-180532

(51) Int. Cl.
  *H10K 50/858* (2023.01)
  *H01L 27/146* (2006.01)
  (Continued)

(52) U.S. Cl.
  CPC ..... *H10K 50/858* (2023.02); *H01L 27/14627* (2013.01); *H01L 33/52* (2013.01);
  (Continued)

(58) Field of Classification Search
  CPC ...... H10K 50/858; H10K 59/35; H10K 50/81; H10K 50/82; H10K 59/873; H01L 33/54; H01L 33/52; H01L 27/4627
  See application file for complete search history.

(56) References Cited

U.S. PATENT DOCUMENTS 6,822,783 B2   11/2004   Matsuda et al.
7,374,328 B2 *   5/2008   Kuroda ............ G02F 1/133606
                                                       349/95
(Continued)

FOREIGN PATENT DOCUMENTS

JP   2006-318807 A   11/2006
JP   2013-016271 A   1/2013
(Continued)

OTHER PUBLICATIONS

Mar. 5, 2024 Korean Official Action in Korean Patent Appln. No. 10-2021-0128508.
(Continued)

*Primary Examiner* — Alonzo Chambliss
(74) *Attorney, Agent, or Firm* — Venable LLP

(57) ABSTRACT

A light-emitting device includes: a substrate; a lens; and a light-emitting part provided between the substrate and the lens, wherein the lens has a convex curved surface portion on an opposite side to the substrate, in a first direction perpendicular to the substrate, the light-emitting part is more distant from the lens than a curvature center of the curved surface portion, when an apex of the curved surface portion in the first direction is referred to as a first position, and an end of the curved surface portion in a second direction in parallel with the substrate is referred to as a second position, and h represents a distance from the first position to the second position in the first direction, and r represents a
(Continued)

distance from the first position to the second position in the second direction, h/r<0.95 is satisfied.

14 Claims, 14 Drawing Sheets

(51) Int. Cl.
   *H01L 33/52* (2010.01)
   *H01L 33/54* (2010.01)
   *H10K 50/81* (2023.01)
   *H10K 50/82* (2023.01)
   *H10K 59/35* (2023.01)
   *H10K 59/80* (2023.01)

(52) U.S. Cl.
   CPC ............. *H01L 33/54* (2013.01); *H10K 50/81* (2023.02); *H10K 50/82* (2023.02); *H10K 59/35* (2023.02); *H10K 59/873* (2023.02)

(56) References Cited

U.S. PATENT DOCUMENTS

| | | | |
|---|---|---|---|
| 7,474,295 B2 | 1/2009 | Matsuda | |
| 7,492,348 B2 | 2/2009 | Matsuda | |
| 8,068,089 B2 | 11/2011 | Matsuda | |
| 8,482,515 B2 | 7/2013 | Matsuda | |
| 8,664,675 B2 * | 3/2014 | Huang | H01L 25/0753 |
| | | | 362/555 |
| 8,835,947 B2 | 9/2014 | Ichinose et al. | |
| 10,686,159 B2 | 6/2020 | Ma et al. | |
| 10,840,470 B2 | 11/2020 | Takahashi | |
| 10,886,503 B2 * | 1/2021 | Cui | H10K 50/858 |
| 11,121,346 B2 | 9/2021 | Ma et al. | |
| 11,515,510 B2 | 11/2022 | Motoyama | |
| 11,997,873 B2 | 5/2024 | Motoyama | |
| 2012/0199859 A1 * | 8/2012 | Shikina | H10K 50/858 |
| | | | 257/40 |
| 2013/0001609 A1 | 1/2013 | Ichinose | |
| 2013/0002130 A1 | 1/2013 | Sumida et al. | |
| 2016/0380238 A1 | 12/2016 | Ma et al. | |
| 2019/0305242 A1 | 10/2019 | Takahashi | |
| 2020/0266391 A1 | 8/2020 | Ma et al. | |
| 2021/0057678 A1 | 2/2021 | Motoyama | |
| 2021/0118959 A1 | 4/2021 | Sano et al. | |
| 2021/0305323 A1 | 9/2021 | Shizuya | |
| 2021/0399264 A1 | 12/2021 | Ueda | |
| 2023/0126274 A1 | 4/2023 | Motoyama | |

FOREIGN PATENT DOCUMENTS

| | | |
|---|---|---|
| JP | 2013-016272 A | 1/2013 |
| JP | 2013-114773 A | 6/2013 |
| JP | 2017-017013 A | 1/2017 |
| JP | 2019-133816 A | 8/2019 |
| KR | 10-2019-0114795 A | 10/2019 |
| KR | 10-2020-0075597 A | 6/2020 |
| WO | 2020/080022 A1 | 4/2020 |

OTHER PUBLICATIONS

JP 2013-016271 A, US 2013/0001609 A1 U.S. Pat. No. 8,835,947 B2, U.S. Pat. No. 8,835,947 B2 was cited in Apr. 12, 2022 IDS.
KR 10-2019-0114795 A (2019-0114795), US 2019/0305242 A1 U.S. Pat. No. 10,840,470.
Mar. 23, 2022 Extended Search Report in European Patent Application No. 21 202 596.9.
Jul. 2, 2024 Japanese Official Action in Japanese Patent Appln. No. 2020-180532.

* cited by examiner

1600

1610

LIGHT-EMITTING DEVICE, DISPLAY DEVICE, IMAGING DEVICE, AND ELECTRONIC DEVICE, WITH SUBSTRATE, LENS INCLUDING CONVEX CURVED SURFACE PORTION, AND LIGHT-EMITTING PART BETWEEN SURFACE OF SUBSTRATE AND LENS

BACKGROUND OF THE INVENTION

Field of the Invention

The present invention relates to a light-emitting device, a display device, an imaging device, and an electronic device.

Description of the Related Art

An organic light-emitting element also referred to as an organic electroluminescence element (organic EL element), or the like is an electronic element having a pair of electrodes and an organic compound layer arranged between the electrodes. Electrons and holes are injected from the pair of electrodes into the organic compound layer, thereby generating an exciton of a luminescent organic compound in the organic compound layer. When the exciton returns to the ground state, the organic light-emitting element emits light The organic light-emitting element has remarkably progressed recently, hence implementation of low driving voltage, various emission wavelengths, and high-speed responsiveness, and the reduction of the thickness/weight of a light-emitting device have been underway.

With the technology described in Japanese Patent Application Publication No. 2017-17013 (PTL 1), a lens is provided in order to improve the amount of light to be extracted from the organic light-emitting device, and the diameter of the lens and the distance between the lens and the light-emitting region are prescribed.

However, with the technology described in PTL 1, the shape of the lens is not prescribed, and light with a sufficiently high color purity cannot be extracted.

SUMMARY OF THE INVENTION

The present invention allows light with a high color purity to be extracted.

The present invention in its first aspect provides a light-emitting device comprising: a substrate; a lens provided above a main surface of the substrate; and a light-emitting part provided between the main surface of the substrate and the lens, wherein the lens has a convex curved surface portion on an opposite side to the substrate, in a first direction perpendicular to the main surface of the substrate, the light-emitting part is provided at a position more distant from the lens than a curvature center of the curved surface portion, when an apex of the curved surface portion in the first direction is referred to as a first position, and an end of the curved surface portion in a second direction in parallel with the substrate is referred to as a second position, and h represents a distance from the first position to the second position in the first direction, and r represents a distance from the first position to the second position in the second direction, $h/r<0.95$ is satisfied.

The present invention in its second aspect provides a display device comprising: a display part having the above mentioned light-emitting device; and a control circuit configured to control the display part. The present invention in its third aspect provides an imaging device comprising: an optical part; an imaging element configured to receive light passed through the optical part; and a display part configured to display an image captured by the imaging element, wherein the display part has the above mentioned light-emitting device. The present invention in its fourth aspect provides an electronic device comprising: a display part having the above mentioned light-emitting device; a housing provided with the display part; and a communication part provided in the housing, and configured to communicate with outside.

Further features of the present invention will become apparent from the following description of exemplary embodiments with reference to the attached drawings.

DESCRIPTION OF THE EMBODIMENTS

Embodiment 1

Embodiment 1 of the present invention will be described. A light-emitting device in accordance with the present embodiment has a substrate, a lens provided on a main surface of the substrate, and a light-emitting part provided between the main surface of the substrate and the lens. Then, the lens (microlens) has a convex (protruding) curved surface portion on the opposite side to the substrate (i.e., on the outer side). Hereinafter, the direction perpendicular to the main surface of the substrate will be described as the "perpendicular direction", and the direction in parallel with the substrate will be described as the "horizontal direction". In the present embodiment, the curved surface portion is assumed to be a part of a spherical surface. Then, the apex (end) of the curved surface portion in the perpendicular direction will be simply described as the "apex of the curved surface portion", and the end of the curved surface portion in the horizontal direction will be simply described as the "end of the curved surface portion". Incidentally, various members other than the lens and the light-emitting part may be provided on the substrate.

Figure 1A:
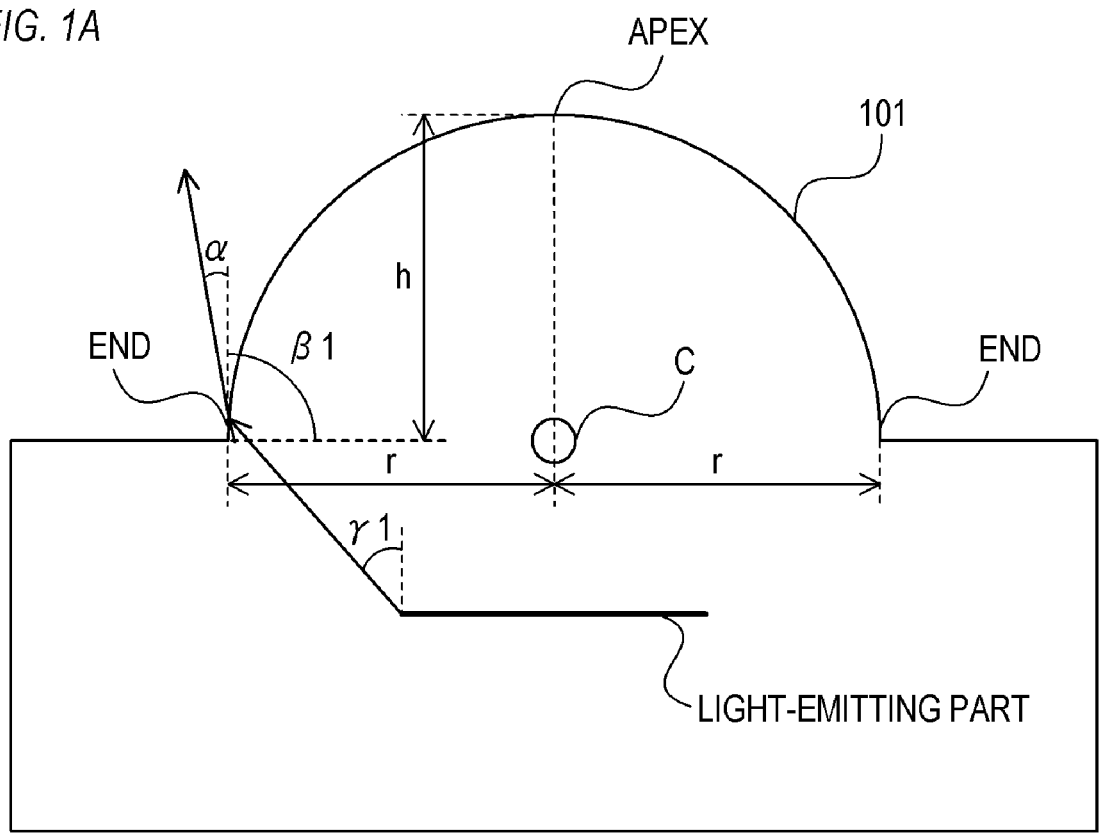
FIGS. 1A and 1B are each a schematic view roughly showing a light-emitting device.

FIG. 1A is a schematic view roughly showing one example of a light-emitting device to be compared with that of the present embodiment. The light-emitting device of FIG. 1A has a substrate, a microlens provided on the substrate, and a light-emitting part provided between the substrate and the microlens. Then, the microlens has a convex curved surface portion 101 on the opposite side to the substrate. FIG. 1A shows a cross section obtained by a plane in the perpendicular direction passing through the apex of the curved surface portion 101.

In FIG. 1A, the curved surface portion 101 is a semi-spherical surface. For this reason, the distance h in the perpendicular direction between the apex of the curved surface portion 101 and the end of the curved surface portion 101 and the distance r in the horizontal direction between the apex of the curved surface portion 101 and the end of the curved surface portion 101 have the relationship of h=r.

Herein, a consideration will be given to the case where a light is emitted from the microlens with a refractive index of $n_1$ into the air with a refractive index of 1. The light emitted from the light-emitting part in the oblique direction (the direction in non-parallel with the perpendicular direction), and the light emitted from the light-emitting part in the front surface direction (the direction in parallel with the perpendicular direction) are different in optical conditions for the light to be emitted into the air. For this reason, the color purity of the light to be emitted from the light-emitting part in the oblique direction may be lower than the color purity of the light to be emitted from the light-emitting part in the front surface direction. Then, the larger the angle of the oblique direction with respect to the front surface direction is, the larger the reduction of the color purity of the light to be emitted from the light-emitting part in the oblique direction is. For this reason, when the light-emitting device is observed from the oblique direction, the light passing through the region where the tilt angle of the microlens (the angle with respect to the horizontal direction) is large is observed with the color purity largely reduced. In FIG. 1A, the tilt angle β1 at the end of the curved surface portion 101 is close to 90 degrees. Then, the exit angle γ=γ1 (the angle with respect to the perpendicular direction) from the light-emitting part toward the end of the curved surface portion 101 is also large. For this reason, when the light-emitting device is observed from the oblique direction, the light emitted from the end of the curved surface portion 101 is observed with the color purity largely reduced.

Figure 1B:
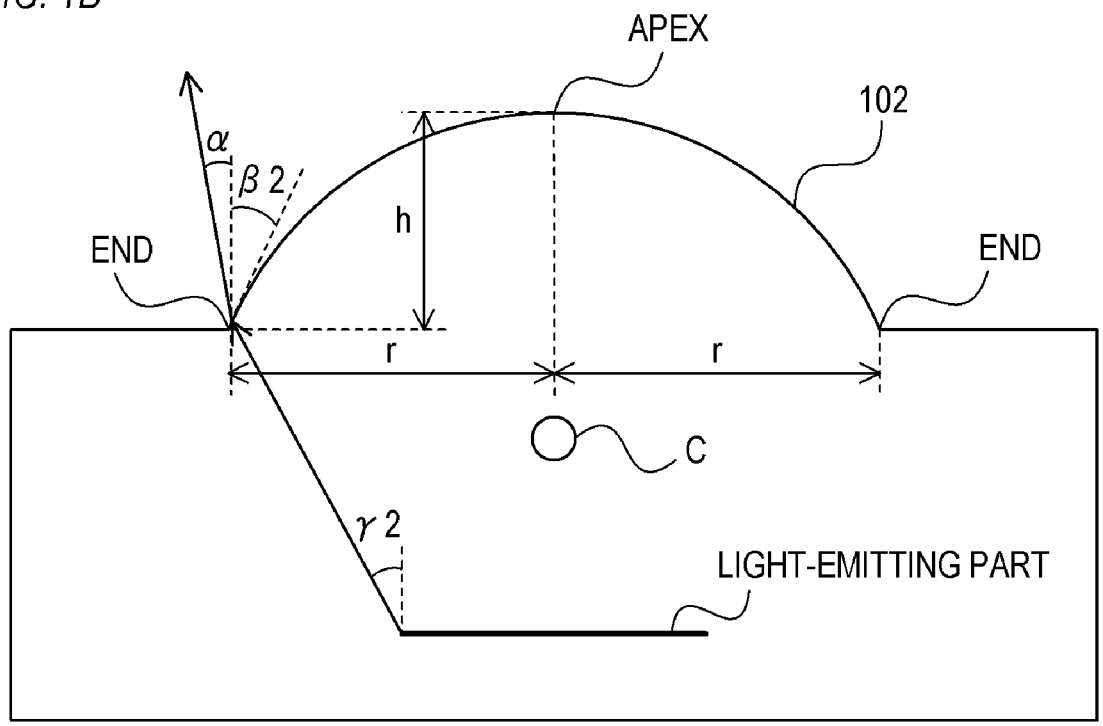

FIG. 1B is a schematic view roughly showing one example of a light-emitting device in accordance with the present embodiment. The light-emitting device of FIG. 1B has a substrate, a microlens provided on the substrate, and a light-emitting part provided between the substrate and the microlens. Then, the microlens has a convex curved surface portion 102 on the opposite side to the substrate. FIG. 1A shows a cross section obtained by a plane in the perpendicular direction passing through the apex of the curved surface portion 102.

In FIG. 1B, the curved surface portion 102 is a part of the spherical surface, and is smaller than a semispherical surface. For this reason, the distance h in the perpendicular direction between the apex of the curved surface portion 102 and the end of the curved surface portion 102, and the distance r in the horizontal direction between the apex of the curved surface portion 102 and the end of the curved surface portion 102 have the relationship of h<r.

Herein, considering the light to be emitted from the microlens in the oblique direction at a specific angle α, from the Snell's law, the larger the tilt angle of the microlens is, the larger the exit angle γ from the light-emitting part becomes. Then, the tilt angle β2 at the end of the curved surface portion 102 is smaller than the tilt angle β1 at the end of the curved surface portion 101. For this reason, the exit angle γ=γ2 from the light-emitting part toward the end of the curved surface portion 102 becomes smaller than the exit angle γ=γ1 from the light-emitting part toward the end of the curved surface portion 101. Therefore, in accordance with the configuration (h<r) of FIG. 1B, as compared with the configuration (h=r) of FIG. 1A, the region where the tilt angle of the microlens is large can be reduced, and the reduction of the color purity of the light emitted in the oblique direction from the light-emitting part can be suppressed. Such effects increase with a decrease in ratio h/r of h and r. For example, preferably h/r<0.95, further preferably, h/r<0.9, and more preferably h/r<0.5. On the other hand, h/r>0.2 is acceptable.

Incidentally, a description has been given to the example in which the curved surface portion of the microlens is a part of the spherical surface. However, the actual shape of the curved surface portion is not required to be in agreement with a part of the spherical surface, and may become a part of a non-spherical surface. In that case, as the actual shape, the surface approximate to a part of the spherical surface may be regarded as a curved surface portion. In the microlens, the boundary between the curved surface portion and other portions may be indefinite as in the case where the tilt of the surface of the microlens smoothly changes over from the curved surface portion to other portions, or other cases. In such a case, for example, the site with the tilt of the tangent in contact with the surface of the microlens equal to or smaller than the threshold value except for the apex of the curved surface portion may be regarded as the end of the curved surface portion.

Then, the example of condensation of light by the microlens will be described by reference to FIGS. 2, 3A, 3B, 4A, 4B, 5A, and 5B. Herein, a consideration will be given to the case where light is emitted from the microlens with a refractive index of $n_1$ into the air with a refractive index of 1.

Figure 2:
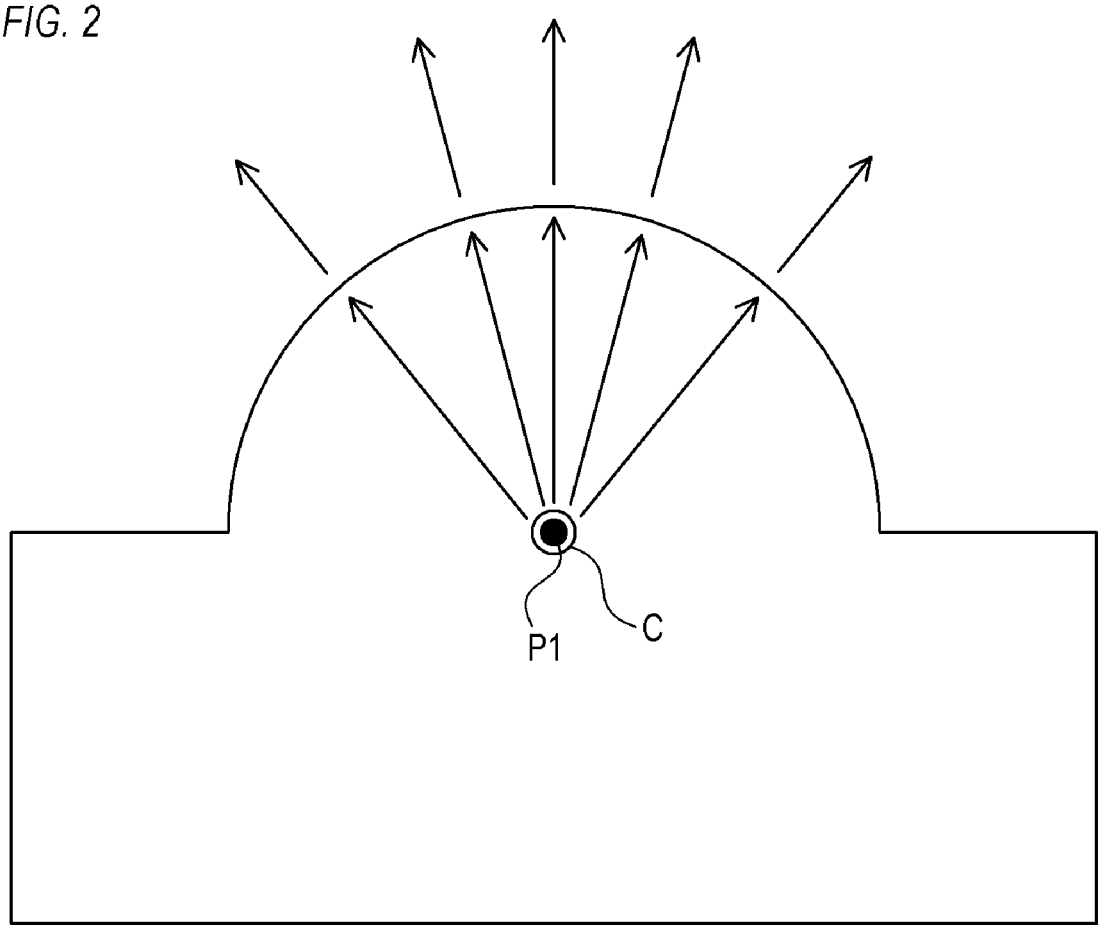
FIG. 2 is a schematic view roughly showing a light-emitting device.
Figure 3A:
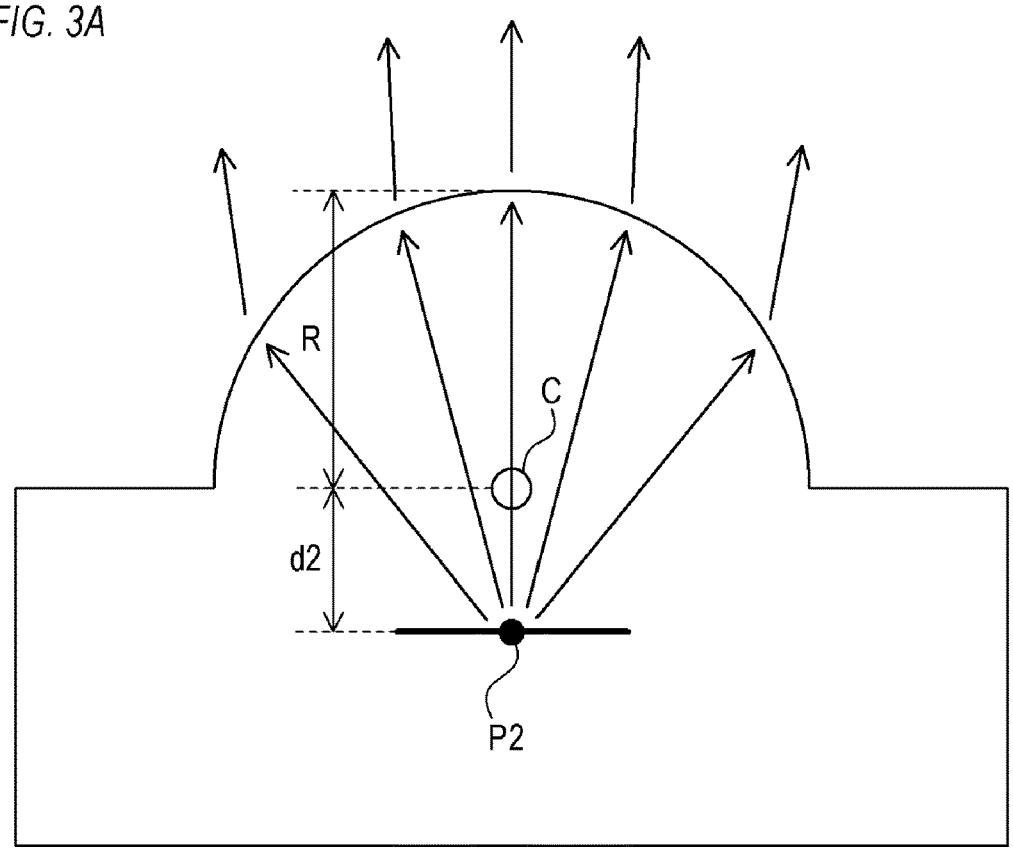
FIGS. 3A and 3B are each a schematic view roughly showing a light-emitting device.
Figure 3B:
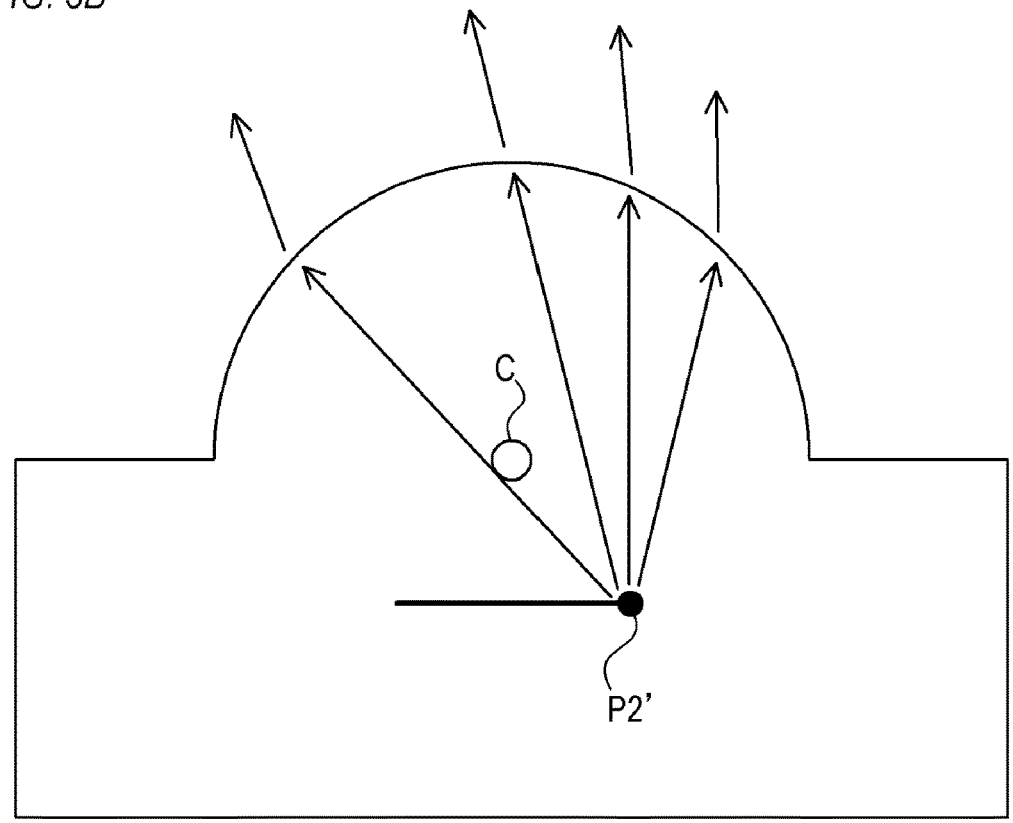

FIGS. 2, 3A, and 3B each show an example of the case where the curved surface portion of the microlens is a semispherical surface (h=r).

In FIG. 2, a light-emitting part P1 (luminous point) is in agreement with the curvature center C of the microlens (curved surface portion). In this case, the light emitted from the light-emitting part P1 is made incident perpendicularly with respect to the tilted surface of the microlens. For this reason, the light emitted from the light-emitting part P1 is emitted with the direction (angle) kept from the microlens into the air. In other words, the light condensation effect cannot be obtained.

FIGS. 3A and 3B each show an example of the case where the light-emitting part is located away in the perpendicular direction from the microlens. In this case, as shown in FIG. 3A, the light emitted in the oblique direction from the central position P2 (the position in agreement with the curvature center C of the microlens in the horizontal direction) of the light-emitting part is brought closer to the front surface direction by the microlens. For this reason, the light condensation effect can be obtained. Further, as shown in FIG. 3B, as the light emitted from the position P2' at the end of the light-emitting part, there is light to be brought closer to the front surface direction by the microlens. The light condensation effect can increase the intensity of the light in the front surface direction as compared with the case where a microlens is not provided, and can enhance the current use efficiency of the light-emitting part. Further, a high light condensation effect with respect to the vicinity of the center of the light-emitting part can be obtained. For this reason, the smaller the light-emitting part is, the higher the current use efficiency can be set.

Figure 4A:
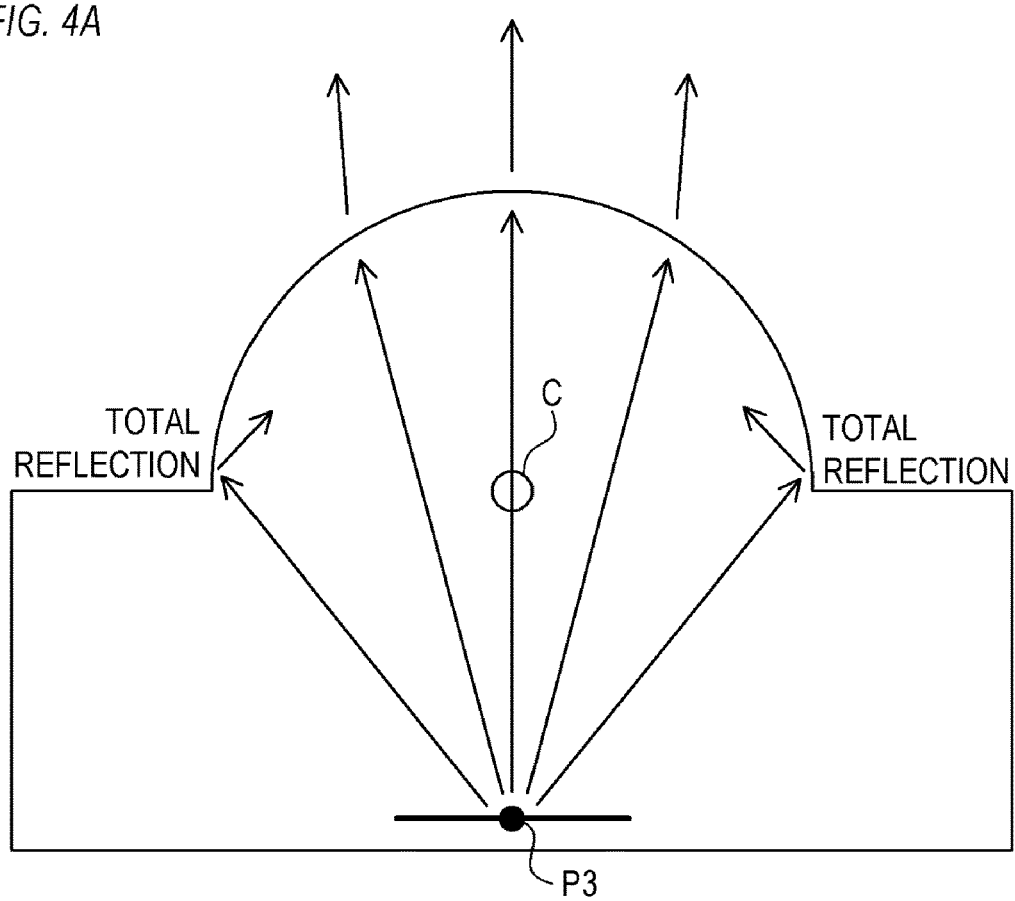
FIGS. 4A and 4B are each a schematic view roughly showing a light-emitting device.
Figure 4B:
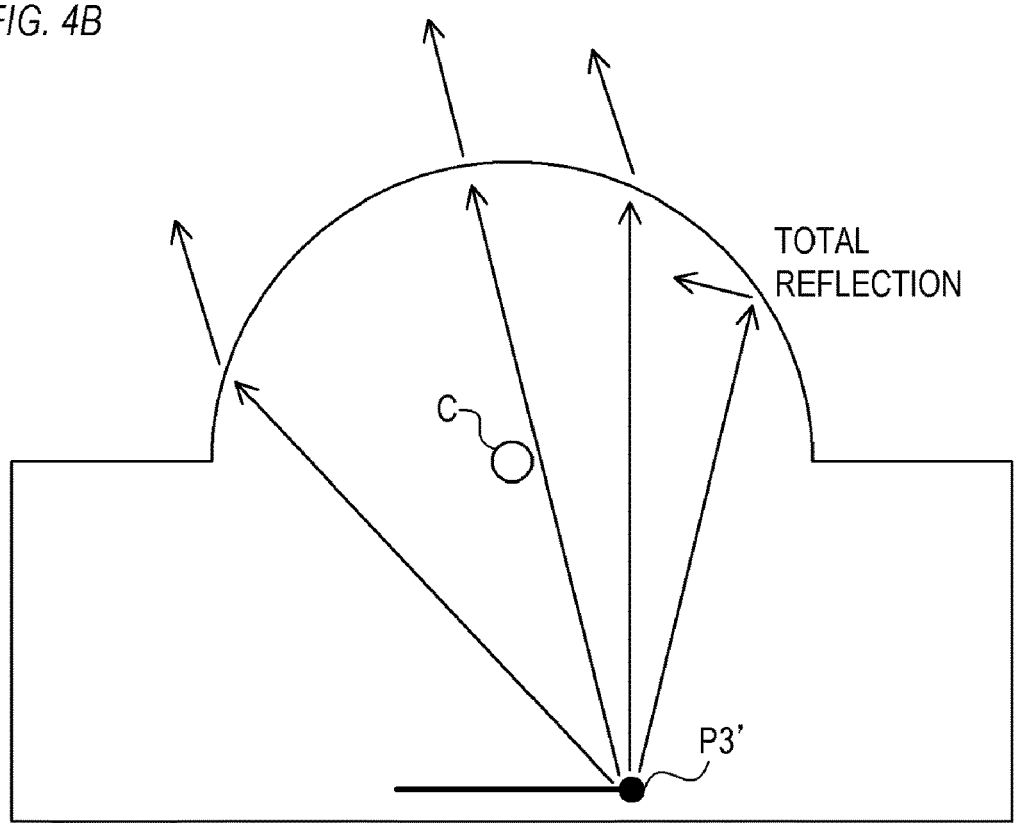

FIGS. 4A and 4B each show an example of the case where the light-emitting part is brought further away from the microlens in the perpendicular direction. In this case, as shown in FIG. 4A, the light condensation effect of the lights emitted from the central position P3 of the light-emitting part to the apex of the microlens (curved surface portion), and the periphery thereof is enhanced. However, the lights emitted to the end of the microlens (curved surface portion) and the periphery thereof are totally reflected by the microlens, and are not extracted into the air. Further, as shown in FIG. 4B, also as the light emitted from the position P3' at the end of the light-emitting part, there is light to be totally reflected by the microlens, and not to be extracted. For this reason, the current use efficiency of the light-emitting part is reduced.

From the description up to this point, it is important for enhancing the current use efficiency of the light-emitting part to properly set the distance in the perpendicular direction between the curvature center C of the microlens and the light-emitting part.

Figure 5A:
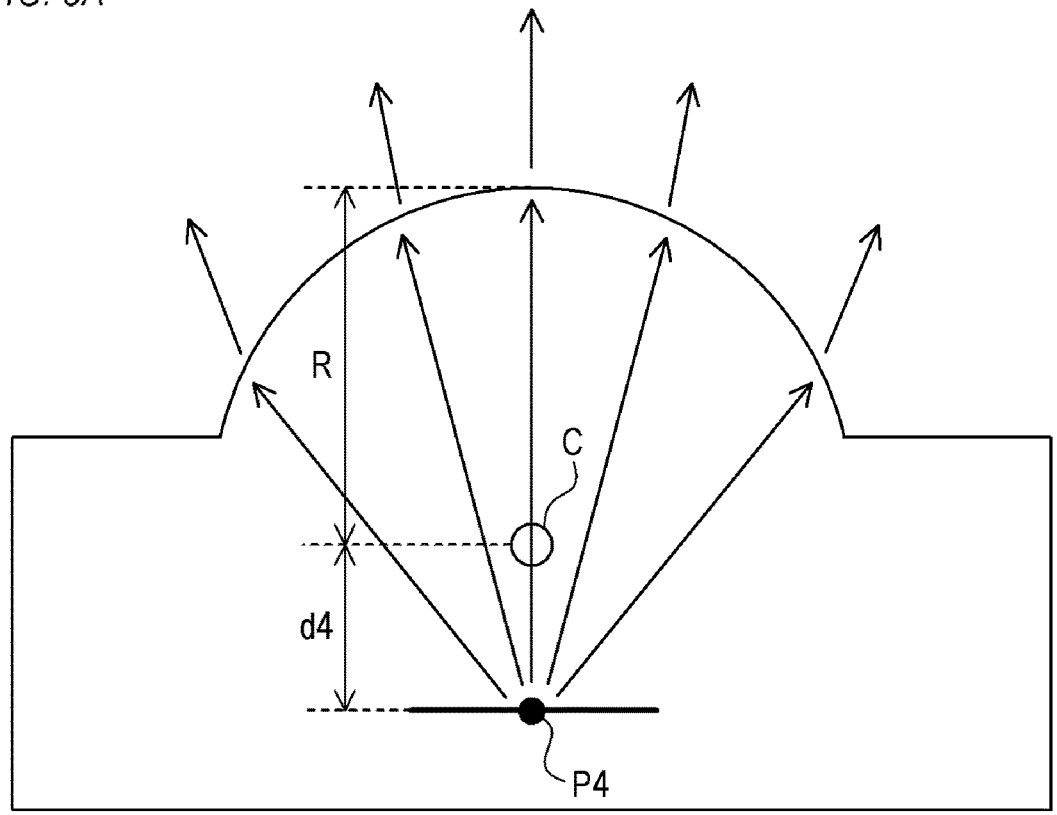
FIGS. 5A and 5B are each a schematic view roughly showing a light-emitting device.
Figure 5B:
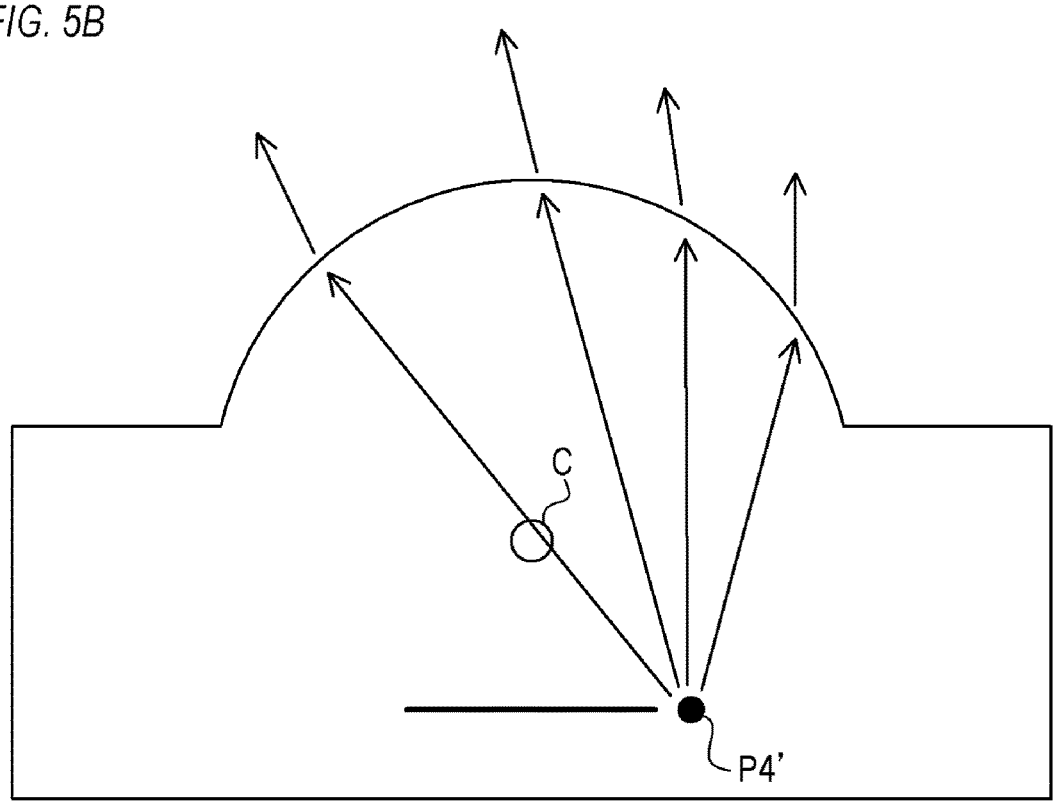

FIGS. 5A and 5B each show an example of the case (h<r) where the curved surface portion of the microlens is a part of the spherical surface, and is smaller than a semispherical surface, in other words, an example of the configuration in accordance with the present embodiment. Also in FIGS. 5A and 5B, as with FIGS. 3A, 3B, and the like, in the perpendicular direction, the light-emitting part is provided at a position more distant from the microlens than the curvature center C of the microlens (curved surface portion). This can also be grasped as that, in the perpendicular direction, the curvature center C of the microlens (curved surface portion) is arranged between the microlens (curved surface portion) and the light-emitting part.

When the light condensation effect of the microlens with respect to the central position P4 of the light-emitting part is desired to be equalized to that of FIG. 3A, it is essential only that the ratio d/R of the curvature radius R of the microlens (curved surface portion) and the distance d in the perpendicular direction between the curvature center C of the microlens and the light-emitting part is equalized to that of FIG. 3A. Specifically, in order to obtain the light condensation effect, the following expression (1) may only be satisfied, and in order to suppress the total reflection at the microlens, the following expression (2) may only be satisfied. The curvature radius R is calculated from the following expression (3). Further, the ratio r/R of the distance r and the curvature radius R is preferably smaller than 0.97. On the other hand, the r/R may be larger than 0.4.

$$d/R > 0 \quad (1)$$

$$d/R < 1 \quad (2)$$

$$R = (r^2 + h^2)/2h \quad (3)$$

Herein, a consideration will be given to the case where the distances r are equal between FIGS. 3A and 3B and FIGS. 5A and 5B. In this case, the curvature radius R in the configuration (h<r) of FIGS. 5A and 5B is larger than the curvature radius R in the configuration (h=r) of FIGS. 3A and 3B. For this reason, when the light condensation effect of the microlens with respect to the central position P4 of the light-emitting part is desired to be equalized to that of FIG. 3A, the distance d=d4 in FIGS. 5A and 5B becomes larger than the distance d=d2 in FIGS. 3A and 3B. At this step, the position at which light emission of the light-emitting part is equal to that of the position P2' becomes the position P4' shown in FIG. 5B. The distance between the central position P4 and the position P4' of the light-emitting part is larger than the distance between the central position P2 and the position P2' of the light-emitting part.

As described previously, the smaller the light-emitting part is, the higher the current use efficiency of the light-emitting part can be set. As shown in FIGS. 5A and 5B, the size of the light-emitting part is equalized to that of FIGS. 3A and 3B, namely, the position of the end of the light-emitting part is set closer to the center than the position P4'. As a result, the light-emitting part becomes relatively smaller with respect to the microlens. Consequently, the current use efficiency can be improved as compared with the configuration (h=r) of FIGS. 3A and 3B.

As described up to this point, provision of a microlens with h<r can suppress the reduction of the color purity when the light-emitting device is observed from the oblique direction than in the case where a microlens with h=r is provided. Further, the current use efficiency of the light-emitting part can be improved.

Figure 6:
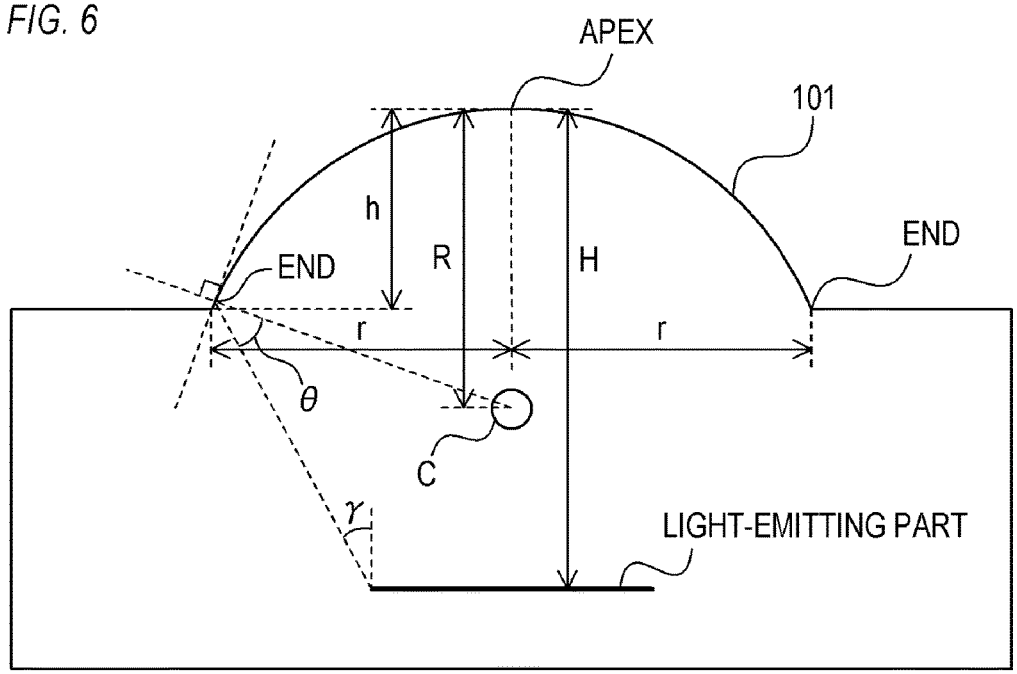
FIG. 6 is a schematic view roughly showing a light-emitting device.

A description will be given to other conditions (conditions different from the expression (1) and the expression (2)) for obtaining the foregoing effects when a microlens with h<r is provided. FIG. 6 is a schematic view roughly showing one example of the light-emitting device in accordance with the present embodiment. In FIG. 6, h<r. Herein, a consideration will be given to the case where the refractive index of $n_2$ from the light-emitting part to the microlens is equal to the refractive index $n_1$ of the microlens. In this case, in order to obtain the light condensation effect with respect to the central position of the light-emitting part, the condition (H>R) may only be satisfied that the distance H in the perpendicular direction between the apex of the microlens and the light-emitting part is larger than the curvature radius R of the microlens. When the refractive index $n_1$ and the refractive index $n_2$ are different, the light is bent by the difference between the refractive index $n_1$ and the refractive index $n_2$. When the distance H is adjusted according to the relative optical distance in consideration of this, the condition for obtaining the light condensation effect is expressed as the following expression (4). Satisfaction of the expression (4) is roughly synonymous with the satisfaction of the expression (1).

[Math. 1]

$$n_1 \times H^2 / \{n_1 \times h + n_2 \times (H-h)\} \times R > 1 \quad (4)$$

Incidentally, when a plurality of members (layers) with mutually different refractive indices are provided between the light-emitting part and the microlens, the weighted average (average refractive index) of the refractive indices of the plurality of members obtained using the weight according to the thickness (layer thickness) of each member may be used as the refractive index $n_2$. The refractive index of the member with the largest thickness of the plurality of members may be used as the refractive index $n_2$. For example, the refractive index of a protective layer described later is about 1.98, and the refractive index of a color filter is about 1.64. For this reason, the refractive index $n_2$ is not less than 1.6 and not more than 2.0. Preferably, the refractive index $n_2$ is not less than 1.65 and not more than 1.9. More preferably, the refractive index $n_2$ is not less than 1.74 and not more than 1.8.

Further, when $n_1=n_2$, in order to obtain the effect that the light from the central position of the light-emitting part toward the end of the microlens is not totally reflected, it is essential only that $n_1 \times \sin \theta < 1$ is satisfied. The $\sin \theta$ is expressed as the following expression (5).

$$\sin \theta = (H-R) \times R^{-1} \times \sin \gamma = (H-R) \times R^{-1} \times r \times \{r^2 + (H-h)^2\}^{-1/2} \quad (5)$$

Accordingly, the conditions for suppressing the total reflection is expressed as the following expression (6).

$$n_1 \times (H-R) \times R^{-1} \times r \times \{r^2 + (H-h)^2\}^{-1/2} < 1 \quad (6)$$

As described above, when the refractive index $n_1$ and the refractive index $n_2$ are different, the distance H may only be adjusted according to the relative optical distance, and the condition for suppressing the total reflection is expressed as the following expression (7). Satisfaction of the expression (7) is roughly synonymous with satisfaction of the expression (2).

[Math. 2]

$$n_1 \times \left(\frac{n_1 \times H}{n_2} - R\right) \times R^{-1} \times r \times \left\{r^2 + \left(\frac{n_1 \times H}{n_2} - h\right)^2\right\}^{-\frac{1}{2}} < 1 \quad (7)$$

As described up to this point, satisfaction of h<r, the expression (4), and the expression (7) can suppress the reduction of the color purity when the light-emitting device is observed from the oblique direction, and the current use efficiency of the light-emitting part can be improved.

As described above, when the curved surface portion of the microlens is not a part of the spherical surface, for example, when the curvature of the end is smaller than the curvature of the spherical surface, or when the curved surface portion is a part of the non-spherical surface, for the actual shape, the surface approximate to a part of the spherical surface may be regarded as a curved surface portion. For example, assuming a spherical surface passing through the apex of the microlens, and the position on the microlens whose distance in the perpendicular direction from the apex is h/2, the distance r and the curvature radius R may be defined based on the assumed spherical surface. Namely, it may be defined such that $r=(2 \times r'^2 - h_2/2)^{1/2}$ and $R=(r'^2+h^2/4)/h$, where r' represents the distance in the horizontal direction between the point at which the distance in the perpendicular direction from the apex of the microlens is h/2, and the apex of the microlens.

Specific Example of Embodiment 1

Figure 7:
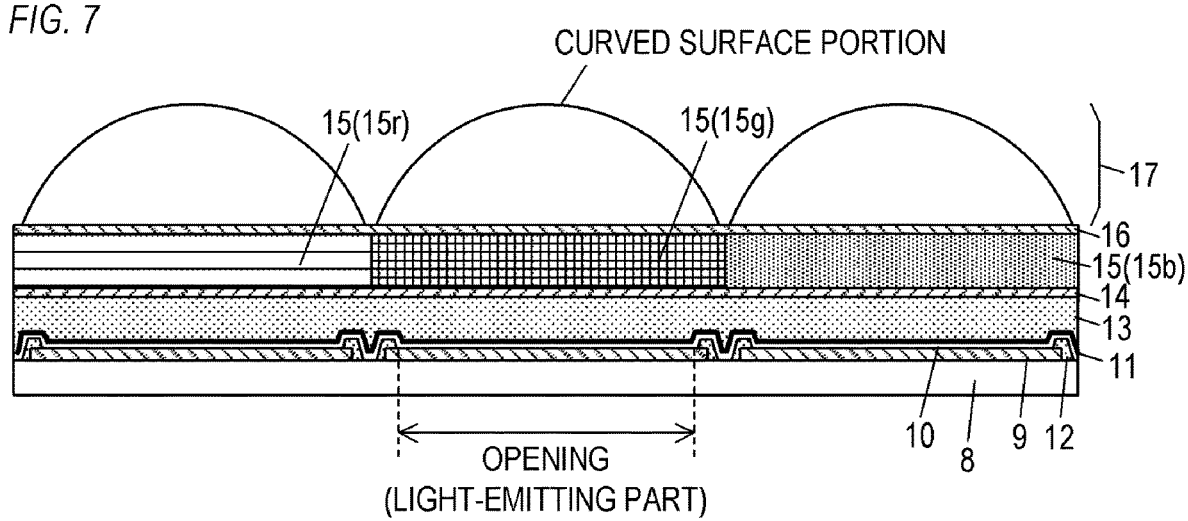
FIG. 7 is a schematic view showing a light-emitting device in accordance with Embodiment 1.

A specific example of Embodiment 1 will be described. FIG. 7 is a schematic view showing a light-emitting device 100 in accordance with the present embodiment. FIG. 7 shows a cross section obtained by the plane in the perpendicular direction passing through the apex of a microlens 17 (curved surface portion). Herein, a description will be given to an example of an organic light-emitting element (a light-emitting element including an organic light-emitting material in a light-emitting part thereof) also referred to as an organic electroluminescence element (organic EL element), or the like. However, the configuration of the light-emitting device is not limited thereto. For example, the light-emitting element may be an inorganic EL element including an inorganic light-emitting material at a light-emitting part thereof. As the light-emitting part, a light-emitting diode, or the like may be used.

The light-emitting device 100 has a substrate 8, a plurality of first electrodes 9, an organic layer 10 (organic film), a second electrode 11, a plurality of insulation layers 12, a protective layer 13, a planarizing layer 14, a plurality of color filters 15, a planarizing layer 16, and a microlens 17. The plurality of first electrodes 9 are provided on the substrate 8. The organic layer 10 includes a light-emitting layer, and a part of the organic layer 10 (light-emitting layer) functions as the light-emitting part. The organic layer 10 is provided between the substrate 8 and the microlens 17 so as to cover the plurality of first electrodes 9. The second electrode 12 is provided on the organic layer 10. The organic layer 10 (light-emitting part) emits light by the different in potential between the first electrode and the second electrode. The plurality of insulation layers 12 (banks) are respectively provided at the plurality of first electrodes 9 so as to establish an insulation among the plurality of first electrodes 9. Each of the plurality of insulation layers 12 has an opening (opening part) for exposing its corresponding first electrode 9 to the organic layer 10. Incidentally, the plurality of insulation layers 12 may be grasped as one insulation layer disposed in contact with the end of the plurality of first electrodes 9, and it may be grasped that the insulation layer has a plurality of opening parts so as to expose the plurality of first electrodes 9, respectively. At the opening part, the first electrode 9 and the organic layer 10 are in contact with each other, and the portion of the organic layer 10 corresponding to the opening of the insulation layer 12 becomes a light-emitting part. For this reason, in FIG. 7, a plurality of light-emitting parts corresponding to the plurality of first electrodes 9, respectively, are provided, and the opening of the insulation layer 12 exposes its corresponding first electrode 9 to the light-emitting part corresponding to the first electrode 9. The protective layer 13 is provided on the second electrode 11, and the planarizing layer 14 is provided on the protective layer 13. The plurality of color filters 15 are provided on the planarizing layer 14 so as to correspond to the plurality of light-emitting parts, respectively. The planarizing layer 16 is provided on the plurality of color filters 15. The microlens 17 has a plurality of curved surface portions corresponding to the plurality of light-emitting parts, respectively, and is provided on the planarizing layer 16.

The material for the substrate 8 has no particular restriction so long as it is a material capable of supporting the first electrodes 9, the organic layer 10, and the second electrode 11. For example, as the material for the substrate 8, glass, plastic silicon, or the like can be used. A switching element such as a transistor, a wire, an interlayer insulation film, and the like may be provided at the substrate 8.

The first electrode 9 may be transparent or opaque. When the first electrode 9 is opaque, the material for the first electrode 9 is preferably a metal material with a reflectance at the emission wavelength of 70% or more. For example, as the material for the first electrode 9, a metal such as Al or Ag, or an alloy obtained by adding Si, Cu, Ni, Nd, or the like thereto can be used. Alternatively, as the material for the first electrode 9, ITO, IZO, AZO, IGZO, or the like can also be used. Incidentally, the emission wavelength herein means the spectrum range of the light emitted from the organic layer 10. When the reflectance of the first electrode 9 is higher than a prescribed (desirable) reflectance, the first electrode 9 may be a lamination electrode with a barrier electrode of a metal such as Ti, W, Mo, or Au, or an alloy thereof, or may be a lamination electrode with a transparent oxide film electrode of ITO, IZO, or the like.

On the other hand, when the first electrode 9 is transparent, a reflection layer may be provided under (on the side of the substrate 8) of the first electrode 9. As the material for the transparent first electrode 9, for example, ITO, IZO, AZO, IGZO, or the like can be used. In order to optimize an optical distance described later, as the configuration of the first electrode 9, a configuration may be adopted in which an insulation film is provided between the reflection layer and the transparent conductive film.

The second electrode 11 has a light-transmissive property. The material for the second electrode 11 may be a semi-transmissive material having a property of transmitting some of the light reached the surface of the second electrode 11, and reflecting other parts thereof (i.e., semi-transmissive reflecting property). As the material for the second electrode 11, for example, a transparent material such as a transparent conductive oxide can be used. Further, as the material for the second electrode 11, a semi-transmissive material can be used which includes a simple substance metal (such as aluminum, silver, or gold), an alkali metal (such as lithium or cesium), an alkaline-earth metal (such as magnesium, calcium, or barium), an alloy material including the metal material, or the like. When a semi-transmissive material is used as the material for the second electrode 11, an alloy including magnesium or silver as a main component is preferably used as a semi-transmissive material. When the second electrode 11 has a preferable transmittance, the second electrode 11 may have a lamination configuration of a plurality of layers formed of the materials. Although one second electrode 11 common among the plurality of light-emitting parts is provided in FIG. 7, a plurality of second electrodes 11 may be provided which correspond to the plurality of light-emitting parts, respectively.

One of the first electrode 9 and the second electrode 11 functions as a positive electrode, and the other functions as a negative electrode. For example, the first electrode 9 functions as a positive electrode, and the second electrode 11 functions as a negative electrode. The first electrode 9 may function as a negative electrode, and the second electrode 11 may function as a positive electrode.

The organic layer 10 can be formed by a known technology such as a vacuum evaporation method or a spin coating method. The organic layer 10 may include a plurality of layers. When the organic layer 10 is an organic compound layer, the organic layer 10 includes at least any of a hole injection layer, a hole transport layer, an electron block layer, a light-emitting layer, a hole block layer, an electron transport layer, and an electron injection layer.

The light-emitting layer emits light by recombination of the holes injected from the positive electrode and the electrons injected from the negative electrode. The light-emitting layer may be a monolayer or a multiple layer. Combination of a light-emitting layer including a red light-emitting material, a light-emitting layer including a green light-emitting material, and a light-emitting layer including a blue light-emitting material can provide a white light resulting from mixing of the lights (a red light, a green light, and a blue light) from respective light-emitting layers. Two kinds of light-emitting layers with respective luminescent colors in the relationship of complementary colors (e.g., a light-emitting layer including a blue light-emitting material and a light-emitting layer including a yellow light-emitting material) may be combined. The material included in the light-emitting layer and the configuration of the light-emitting layer may be varied so that the light-emitting layer may emit a different-color light for each light-emitting part. In that case, each light-emitting layer may be patterned for every light-emitting part.

The light-emitting device in accordance with the present embodiment may have a first reflecting surface, a second reflecting surface, and a light-emitting layer arranged between the first reflecting surface and the second reflecting surface. The first reflecting surface may be a first electrode 9, or may be a reflecting layer arranged between the first electrode 9 and the insulation layer 12.

In order to optimize the optical distance between the first reflecting surface and the light-emitting part (luminescent position) of the organic layer 10 including the light-emitting layer, the following expression (8) may only be satisfied. In the expression (8), Lr is the optical path length (optical distance) from the upper surface of the first reflecting surface to the luminescent position of the organic layer 10, φr is the phase shift when a light with a wavelength of λ is reflected by the first reflecting surface, and m is an integer of 0 or more. The film thickness of the first electrode 9 or the first reflecting surface, the film thickness of the organic layer 10, or the like may only be optimized so as to satisfy the expression (8).

$$Lr = (2 \times m - (\phi r/\phi \lambda)) \times (\lambda/4) \quad (8)$$

Further, the optical distance Ls from the luminescent position to the second reflecting surface satisfies the following expression (9) where φs denotes the phase shift when light with a wavelength of λ is reflected by the second reflecting surface. In the present embodiment, m'=0.

$$Ls = (2 \times m' - (\phi s/\pi)) \times (\lambda/4) = -(\phi s/\pi) \times (\lambda/4) \quad (9)$$

Accordingly, overall-layer interference L satisfies the following expression (10). In the expression (10), φ is the sum of the phase shift φr and the phase shift φs.

$$L = Lr + Ls = (2 \times m - \phi/\pi) \times (\lambda/4) \quad (10)$$

Herein, in the expressions (8) to (10), the allowable range is about λ/8, or about 20 nm. Incidentally, the luminescent position of the organic layer 10 may be difficult to identify. For this reason, in the foregoing example, the luminescent position was substituted with the interface on the first reflecting surface side or the interface on the second reflecting surface side of the organic layer 10. In consideration of the foregoing allowable range, even in such a substituted case, the effect of intensifying the light can be obtained.

The protective layer 13 is an insulation layer, and has a light-transmissive property, and preferably includes an inorganic material low in transmissivity of external oxygen and moisture. For example, the protective layer 13 can be manufactured using inorganic materials such as silicon nitride (SiN), silicon oxynitride (SiON), silicon oxide ($SiO_x$), aluminum oxide ($Al_2O_3$), and titanium oxide ($TiO_2$). Particularly, in terms of the protection performance, inorganic materials such as SiN, SiON, and $Al_2O_3$ are preferable. For the formation of the protective layer 13, a chemical gas phase deposition method (CVD method), an atomic layer deposition method (ALD method), a sputtering method, or the like is preferably used.

The protective layer 13 may have a monolayer structure, or may have a lamination structure obtained by combining the foregoing materials and formation methods so long as it has a sufficient moisture blocking performance. For example, the protective layer 13 may have a lamination structure of a silicon nitride layer and other layers with a high density resulting from the atomic layer deposition method. Further, when the protective layer 13 has a moisture blocking performance, it may have an organic layer. The organic layer includes, for example, polyacrylate, polyimide, polyester, or epoxy. Further, in FIG. 7, one protective layer 13 common among the plurality of light-emitting parts is provided. However, there may be provided a plurality of protective layers 13 respectively corresponding to the plurality of light-emitting parts.

The microlens 17 can be formed by an exposure and development process. Specifically, a film (photoresist film) including the material for the microlens 17 is formed. Using a mask having a continuous change in gradation, exposure and development of the photoresist film are performed. As such a mask, a gray mask can be used. There also can be used an area gradation mask including a lightproof film with a resolution equal to or smaller than the resolution of an exposure device, and enabling light application having a continuous change in gradation to the imaging surface by changing the density distribution of dots. Further, the microlens 17 formed by the exposure and development process is etched back. This enables adjustment of the lens shape. As described previously, the microlens 17 may only have a curved surface portion with h<r, and the curved surface portion may be a part of the spherical surface, or may not be so.

Figure 8A:
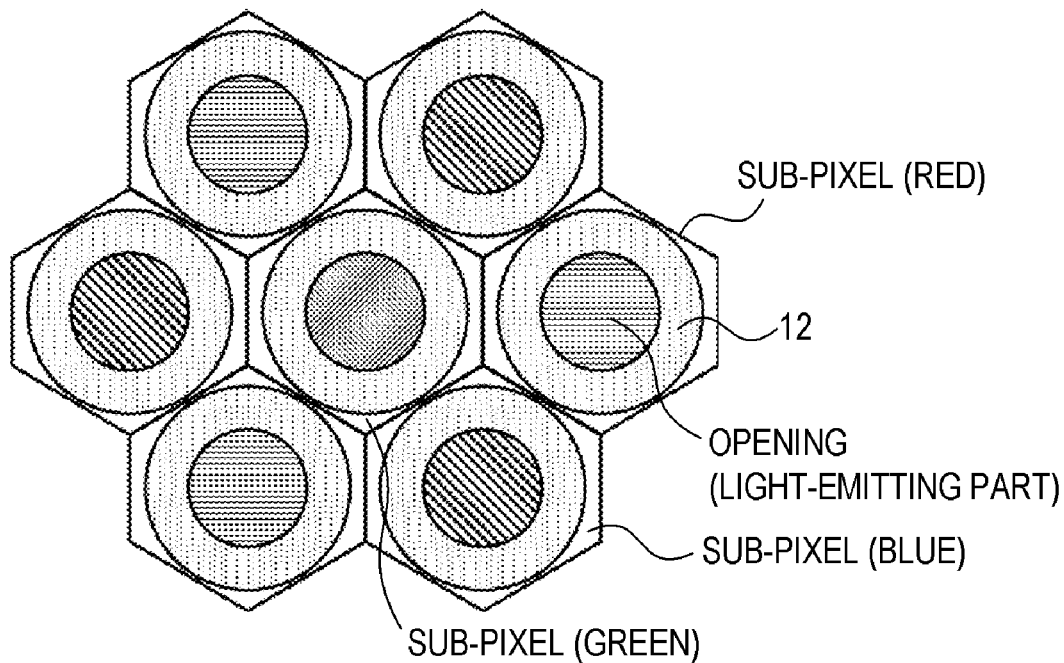
FIGS. 8A to 8C are each a schematic view showing the array of light-emitting elements in the light-emitting device in accordance with Embodiment 1.
Figure 8B:
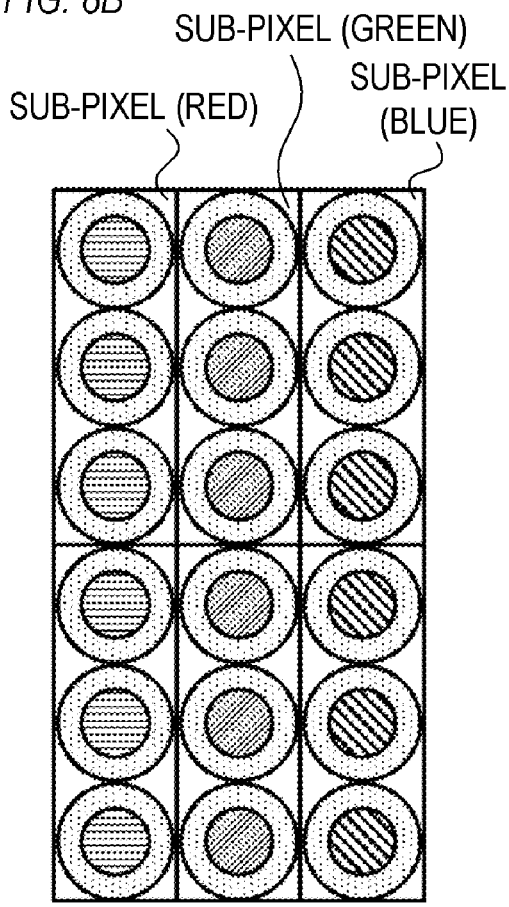
Figure 8C:
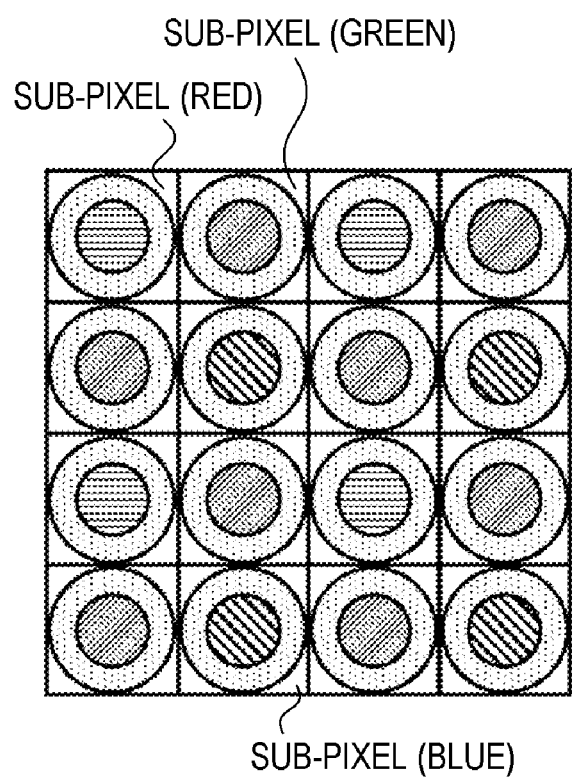

The light-emitting part, the curved surface portion of the microlens 17, and the like are combined, thereby forming a light-emitting element. When a plurality of light-emitting elements are provided, the planar array (the array as viewed from the perpendicular direction) of the plurality of light-emitting elements may be any array of a stripe array, a square array, a delta array, a pentile array, a Bayer array, and the like. FIGS. 8A to 8C are each a plan view of the light-emitting device 100 as viewed from the side of the microlens 17, and each show one example of the planar array of the plurality of light-emitting elements. FIG. 8A shows one example of the delta array, FIG. 8B shows one example of the stripe array, and FIG. 8C shows one example of the Bayer array. Herein, a consideration will be given to the case where the light-emitting device 100 is used as a display panel, and 1 pixel (main pixel) includes a plurality of sub-pixels mutually different in corresponding color component (e.g., a sub-pixel for displaying a red color, a sub-pixel for displaying a green color, and a sub-pixel for displaying a blue color). In this case, as shown in FIG. 8B, a plurality of light-emitting elements may be provided for one sub-pixel. The size and the shape of the curved surface portion of the microlens 17 may be appropriately set according to the system of the planar array of the plurality of light-emitting elements. When the delta array is adopted, the area occupied by the curved surface portion of the microlens 17 with respect to the sub-pixel can be set large, and the light extraction efficiency can be enhanced.

In the example of FIGS. 8A to 8C, the planar shape (the shape as viewed from the perpendicular direction) of the light-emitting part is a circular shape. The planar shape of the light-emitting part has no particular restriction, and may be, for example, a polygonal shape such as a rectangular shape, or a hexagonal shape. However, when the planar shape of the light-emitting part is a circular shape, the tilt angles in the direction from the end of the light-emitting part to the ends of the microlens 17 (curved surface portion) have the relationship of being equal in every cross section obtained by the plane in the perpendicular direction passing through the apex of the curved surface portion, which facilitates the design thereof.

Figure 9:
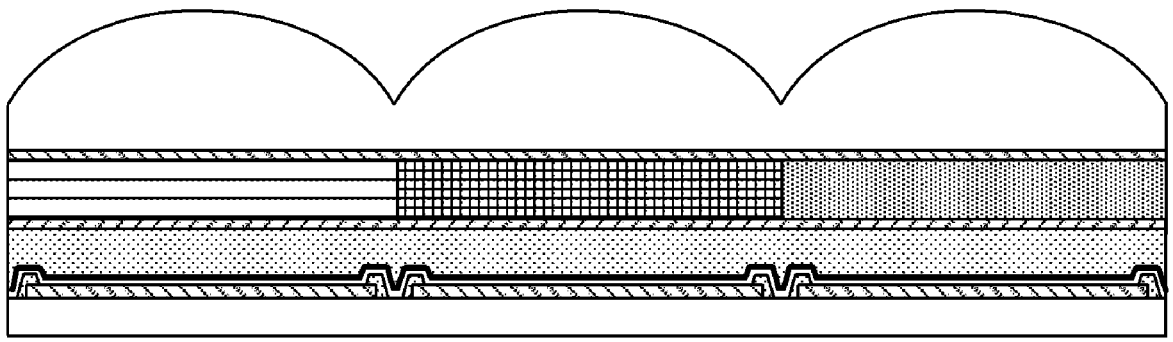
FIG. 9 is a schematic view showing the light-emitting device in accordance with Embodiment 1.

As shown in FIG. 9, the microlens 17 may be formed so that the end of the curved surface portion of the microlens 17 has a thickness (so that the microlenses 17 partially overlap each other between the adjacent light-emitting parts). Also, in this case, when the conditions such that h<r, the expression (4), and the expression (7) are satisfied, it is possible to suppress the reduction of the color purity when the light-emitting device is observed from the oblique direction, and it is possible to improve the current use efficiency of the light-emitting part.

Alternatively, there may be adopted such a configuration that the plurality of curved surface portions of the microlens 17 emit lights of mutually different colors. Such configuration enables full-color display. As the method for implementing full-color display, a method using a light-emitting layer for emitting a white light, and a color filter 15 may be adopted, or a method in which the light-emitting layer is patterned so that a plurality of light-emitting parts emit lights of mutually different colors may be adopted. Still alternatively, by varying the distance between the first reflecting surface and the second reflecting surface for each light-emitting part, full-color display may be enabled. By adopting the configuration that the distance between the first reflecting surface and the second reflecting surface is varied for each light-emitting part, the light-emitting layer can be shared among a plurality of light-emitting parts. For this reason, the manufacturing process of the light-emitting layer becomes easier than with the method for patterning the light-emitting layer.

Although in the present embodiment, the color filter 15 is provided on the planarizing layer 14, the color filter 15 may be provided on the protective layer 13. In other words, the color filter 15 and the protective layer 13 may be integrated with each other (the color filter 15 and the protective layer 13 may be continuous). The color filter 15 may be formed on another substrate, and may be bonded to the protective layer 13 in an opposing manner. The planarizing layer 14 is provided in order to planarize the unevenness of the protective layer 13. The color filter 15 and the protective layer 13 are integrated with each other. As a result, using a photolithography process, the color filter 15 can be formed in alignment with the light-emitting part with high precision.

In FIG. 7, the color filters 15r, 15g, and 15b may be color filters for transmitting lights of mutually different colors therethrough, or may not be so. For example, the color filter 15r may transmit a red light therethrough, the color filter 15g may transmit a green light therethrough, and the color filter 15b may transmit a blue light therethrough. This configuration enables full-color display. Incidentally, a part or the whole of the plurality of color filters 15 may be omitted. In that case, the following is also acceptable: the light-emitting layers in the organic layer 10 are formed differently, so that the colors of the lights emitted from the plurality of light-emitting parts are made mutually different, thereby enabling full-color display.

Further, although the microlens 17 is provided on the planarizing layer 16 in the present embodiment, the microlens 17 may be provided on the color filter 15. In other words, the microlens 17 and the color filter 15 may be integrated with each other. The planarizing layer 16 is provided for planarizing the unevenness of the color filter 15. The microlens 17 may be provided on the protective layer 13 without using the color filter 15 (the microlens 17 and the protective layer 13 may be integrated with each other). When the microlens 17 and the protective layer 13 are integrated with each other, the distance from the microlens 17 to the light-emitting layer can be made shorter than in the case where the microlens 17 is formed on another substrate, and is bonded to the protective layer 13 in an opposing manner. As a result, the solid angle of the light made incident upon the microlens 17 from the light-emitting layer can be enlarged, resulting in an improvement of the light extraction efficiency. By integrating the microlens 17 and the protective layer 13 with each other, the curved surface portion of the microlens 17 can be formed in alignment with the light-emitting part with high precision. Further, the color filter 15, the microlens 17, and the protective layer 13 are integrated, which enables the alignment among the light-emitting part, the color filter 15, and the microlens 17 to be performed with high precision.

The order of stacking of the color filter 15 and the microlens 17 may be appropriately selected. In FIG. 7, the color filter 15 is provided on the side of the light-emitting part with respect to the microlens 17. With this configuration, the light emitted from the light-emitting part passes through the color filter 15 before being made incident upon the microlens 17. As a result, the light to cause the reduction of the color purity (the light with a large exit angle from the light-emitting part) passes through the color filter 15 over a relatively larger distance. For this reason, it is possible to more preferably suppress the reduction of the color purity when the light-emitting device 100 is observed from the oblique direction.

Alternatively, the light-emitting device 100 may be manufactured by forming the color filter 15 and the microlens 17 on another substrate, and bonding them to the substrate 8 having a light-emitting part in an opposing manner. By doing so, the degree of freedom of the processing method for the formation of the color filter 15 and the microlens 17 (such as the temperature) is enhanced, so that the degree of freedom of design of the color filter 15 and the microlens 17 can be enhanced. The microlens 17 and the color filter 15 are fixed on the side of the substrate 8 by, for example, an adhesive. The adhesive may be applied on the protective layer 13, or may be applied on the planarizing layer 14.

Further, the microlens 17 may be fixed on the substrate 8 at the end of the light-emitting device 100 by an adhesive so that a space is provided between the microlens 17 and the protective layer 13 (or the color filter 15). In that case, the space may be filled with a filler resin. The refractive index of the filler resin is preferably smaller than the refractive index of the microlens 17.

Alternatively, the following is also acceptable: the color filter 15 is formed integrally on the protective layer 13; and the microlens 17 is formed on another substrate, and is bonded to the color filter 15 in an opposing manner.

Below, a description will be given to a specific example of the manufacturing method of the light-emitting device 100.

First, aluminum was formed on the substrate 8, and this was patterned, thereby forming a plurality of first electrodes 9. Then, a plurality of insulation layers were formed so as to cover the plurality of first electrodes 9, respectively. As the material for the insulation layer, silicon oxide was used, and the layer thickness of the insulation layer was set at 65 nm. Then, in each insulation layer, an opening for exposing its corresponding first electrode 9 (covered first electrode 9) is provided, and the plurality of insulation layers were assumed to be a plurality of insulation layers 12. The shape of the opening was set as a circular shape with a radius of 3.0 μm. As described above, finally, the opening of the insulation layer 12 exposes its corresponding first electrode 9 with respect to the light-emitting part corresponding to the first electrode 9. As viewed from the perpendicular direction, the size and the shape of the opening are in agreement with the size and the shape of the light-emitting part.

Then, on the first electrode 9 (and the insulation layer 12), the organic layer 10 (an organic compound layer) was formed. Specifically, as a hole injection layer, the following compound 1 was formed with a thickness of 3 nm. Then, as a hole transport layer, the following compound 2 was formed with a thickness of 15 nm, and as an electron block layer, the following compound 3 was formed with a thickness of 10 nm. Then, the first light-emitting layer was formed with a thickness of 10 nm so as to include the following compound 4 in a weight ratio of 97% as a host material, and the following compound 5 in a weight ratio of 3% as a luminescent dopant. The second light-emitting layer was formed with a thickness of 10 nm so as to include the following compound 4 in a weight ratio of 98% as a host material, and the following compound 6 and the following compound 7 in each weight ratio of 1% as a luminescent dopant. The electron transport layer was formed with a thickness of 110 nm with following compound 8. The electron injection layer was formed with a thickness of 1 nm with lithium fluoride.

[Chem. 1]

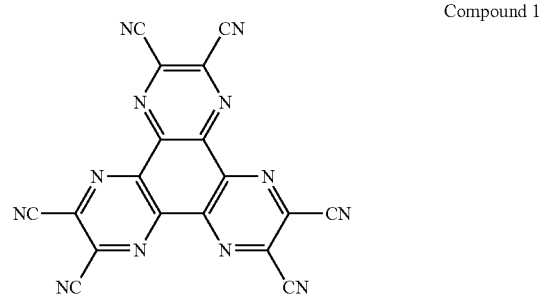

Compound 1

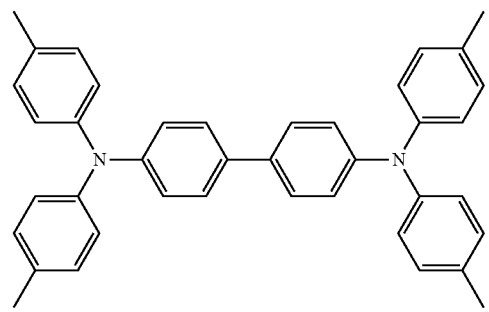

Compound 2

Compound 3

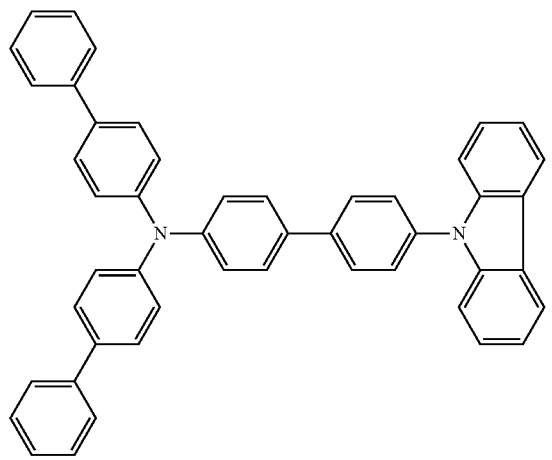

Compound 4

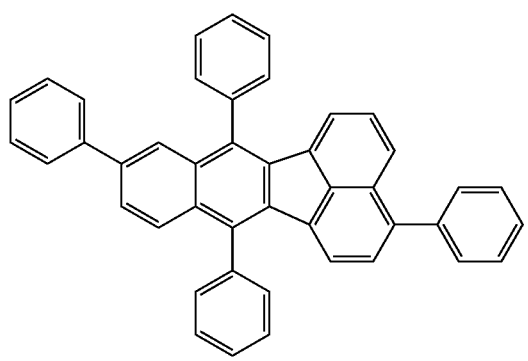

Compound 5

Compound 6

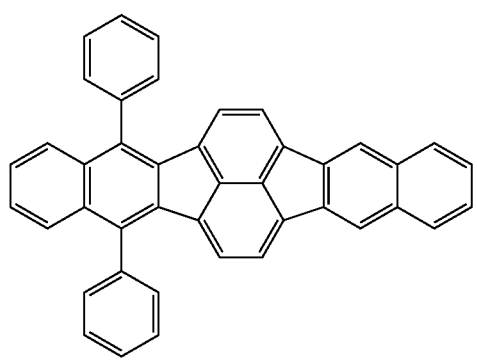

Compound 7

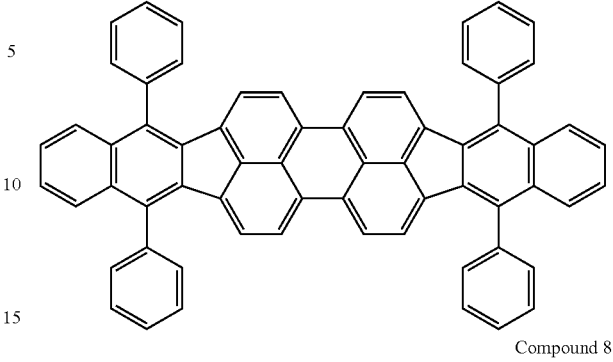

Compound 8

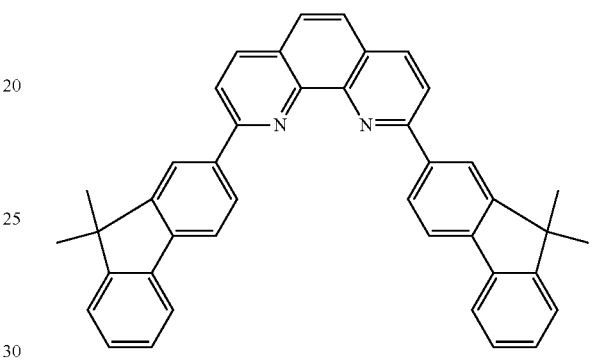

Then, on the organic layer 10, a MgAg alloy was formed with a thickness of 10 nm as the second electrode 11. The ratio of Mg and Ag was set at 1:1. Subsequently, on the second electrode 11, a SiN film with a refractive index of 1.97 was formed with a thickness of 1 µm with the CVD method as the protective layer 13. Further, on the protective layer 13, a planarizing layer 14 with a refractive index of 1.55 was formed with a thickness of 300 nm by spin coating.

Then, on the planarizing layer 14, a color filter 15 with a refractive index of 1.65 was formed with a thickness of 1.6 µm. The color filter 15*r* was assumed to be a color filter for transmitting a red light therethrough, the color filter 15*g* was assumed to be a color filter for transmitting a green light therethrough, and the color filter 15*b* was assumed to a color filter for transmitting a blue light therethrough. Further, on the color filter 15, a planarizing layer 16 was formed with a thickness of 200 nm by spin coating.

Then, on the planarizing layer 16, a microlens 17 with a refractive index of 1.52 was formed using an exposure and development process. The curved surface portion of the microlens 17 was assumed to be a part of the spherical surface, and the distance h between the apex of the curved surface portion and the end of the curved surface portion was set at 2.5 µm, and the distance r in the horizontal direction was set at 3.4 µm.

With the light-emitting device 100 manufactured as described up to this point, the curvature radius $R=(r^2+h^2)/2h$ of the microlens 17 (curved surface portion) was 3.56 µm. Then, refractive index $n_1$ of the microlens 17 was 1.52, the refractive index $n_2$ of from the light-emitting part to the microlens 17 was 1.74, and the distance H in the perpendicular direction from the apex of the microlens 17 to the light-emitting part was 5.6 µm. At this step, the left side of the expression (4) is calculated to be 1.45, and the left side of the expression (7) is calculated to be 0.46, so that the expression (4) and the expression (7) are satisfied. Therefore, it is possible to suppress the reduction of the color purity when the light-emitting device is observed from the oblique direction. In addition, the current use efficiency of the light-emitting part can be improved as compared with the case where the microlens 17 is not provided.

Embodiment 2

Figure 10:
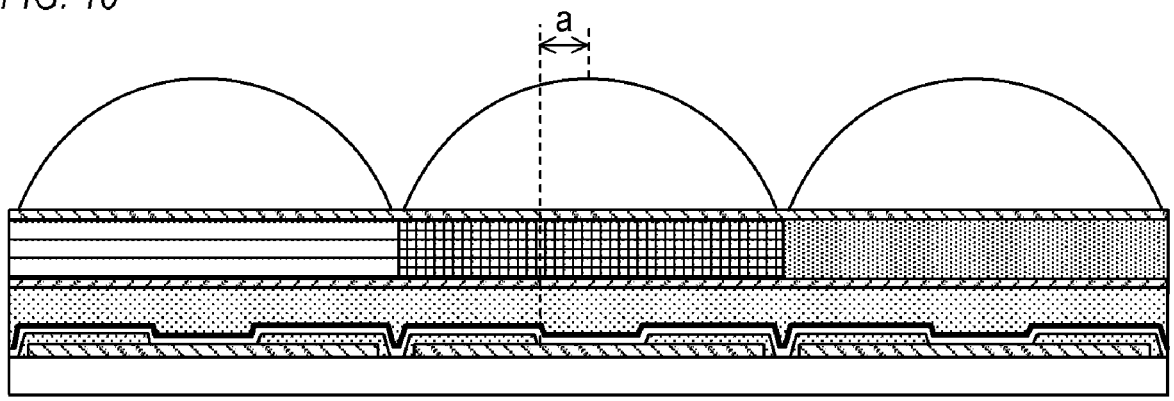
FIG. 10 is a schematic view showing a light-emitting device in accordance with Embodiment 2.

Embodiment 2 of the present invention will be described. In Embodiment 1 (specific example), the shape of the light-emitting part (as viewed from the perpendicular direction) was set as a circular shape with a radius of 3.0 μm. However, in the present embodiment, the shape of the light-emitting part is set as a circular shape with a radius of 1.0 μm. Embodiment 2 is the same as Embodiment 1 except for this. FIG. 10 is a schematic view showing a light-emitting device 100 in accordance with the present embodiment. FIG. 10 shows a cross section obtained by a plane in the perpendicular direction passing through the apex of the microlens 17 (curved surface portion).

As described above, when the microlens 17 is provided on the light-emitting part, a high light condensation effect can be obtained with respect to the position close to immediately under the apex of the microlens 17 (curved surface portion). Namely, by making the light-emitting part smaller, the current use efficiency of the light-emitting part can be improved. Herein, in order to obtain the effect that the light emitted in the perpendicular direction from the light-emitting part is not totally reflected by the tilted surface of the microlens 17, the following the expression (11) may only be satisfied.

$$a < R/n_1 \quad (11)$$

where "a" represents the distance in the horizontal direction from the end of the light-emitting part to the apex of the microlens 17 (curved surface portion).

In the present embodiment, distance a=1.0 μm, and $R/n_1$=2.34 μm, and hence the relationship of $a<R/n_1$ is satisfied. For this reason, while suppressing the total reflection at the microlens 17, the light-emitting part is made smaller. As a result, the current use efficiency of the light-emitting part can be more improved. From the viewpoint of obtaining such an effect, for example, $a/(R/n_1)$ is preferably 0.85 or less. On the other hand, $a/(R/n_1)$ may be 0.6 or more.

Embodiment 3

Figure 11:
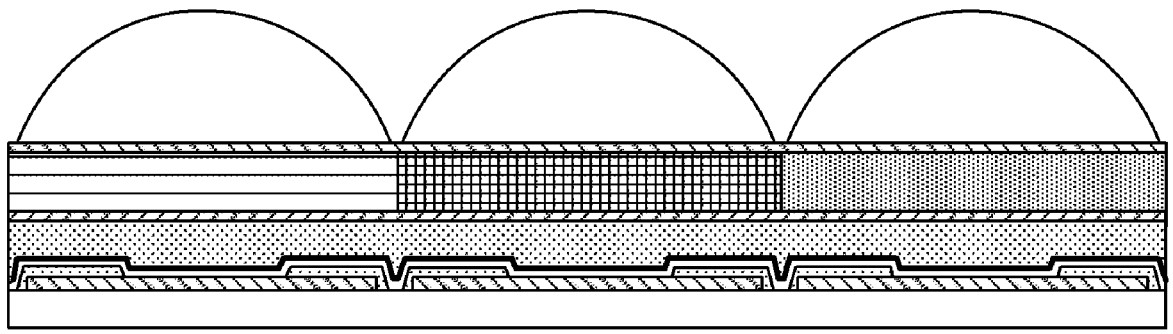
FIG. 11 is a schematic view showing a light-emitting device in accordance with Embodiment 3.

Embodiment 3 of the present invention will be described. In Embodiment 2, the shape of the light-emitting part was set to be a circular shape with a radius of 1.0 μm. However, in the present embodiment, the shape of the light-emitting part is set to be a circular shape with a radius of 2.0 μm. Embodiment 3 is the same as Embodiment 2 except for this. FIG. 11 is a schematic view showing a light-emitting device 100 in accordance with the present embodiment. FIG. 11 shows a cross section obtained by a plane in the perpendicular direction passing through the apex of the microlens 17 (curved surface portion).

Herein, a consideration will be given to the process in which the light with a high color purity emitted in the front surface direction from the light-emitting part is refracted by the tilted surface of the microlens 17, to be extracted in the wide-angle direction (the oblique direction). Considering such a process, the larger the angle of the tilted surface of the microlens 17 immediately on the light-emitting part is, the more the reduction of the color purity when the light-emitting device 100 is observed from the oblique direction can be suppressed, which is preferable. Namely, when the shapes of the microlenses 17 are the same, the larger the distance a in the horizontal direction from the end of the light-emitting part to the microlens 17 (curved surface portion) is, the more the reduction of the color purity when the light-emitting device 100 is observed from the oblique direction can be suppressed.

In the present embodiment, by increasing the distance a while satisfying the relationship of $a<R/n_1$, it is possible to improve the current use efficiency of the light-emitting part. In addition, it is possible to more suppress the reduction of the color purity when the light-emitting device 100 is observed from the oblique direction. From the viewpoint of obtaining such effects, for example, $a/(R/n_1)$ is preferably 0.6 or more.

Embodiment 4

Figure 12:
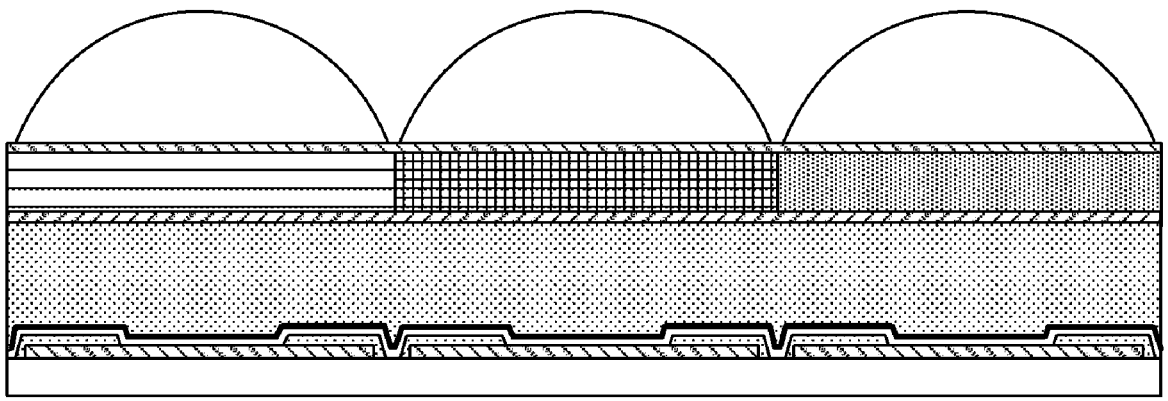
FIG. 12 is a schematic view showing a light-emitting device in accordance with Embodiment 4.

Embodiment 4 of the present invention will be described. In Embodiment 1 (specific example), the thickness of the protective layer 13 (SiN film) was set at 1 μm. However, in the present embodiment, the thickness of the protective layer 13 (SiN film) is set at 1.5 μm. Embodiment 4 is the same as Embodiment 1 except for this. FIG. 12 is a schematic view showing the light-emitting device 100 in accordance with the present embodiment. FIG. 12 shows a cross section obtained by a plane in the perpendicular direction passing through the apex of the microlens 17 (curved surface portion).

When the thickness of the protective layer 13 (SiN film) is set at 1.5 μm, $n_2$=1.79 and H=6.6 μm. Also, in this case, the expression (4) and the expression (7) are satisfied.

Herein, a consideration will be given to the process in which the light emitted from the central position of the light-emitting part toward the end of the microlens 17 (the curved surface portion) is refracted by the end of the microlens 17. Considering such a process, when the distance r of the microlens 17 is constant, the larger the distance in the perpendicular direction from the light-emitting part to the microlens 17 is, the smaller the exit angle of the light from the light-emitting part becomes. For this reason, the reduction of the color purity when the light-emitting device 100 is observed from the oblique direction can be more suppressed.

In the present embodiment, the light (the light with a low color purity) emitted from the light-emitting part to the wide-angle direction is totally reflected by the microlens 17 (curved surface portion) of the adjacent sub-pixel, and is not extracted to the outside. For this reason, by increasing the distance in the perpendicular direction from the light-emitting part to the microlens 17 (curved surface portion), it is possible to more suppress the reduction of the color purity when light-emitting device 100 is observed from the oblique direction.

Embodiment 5

Figure 13:
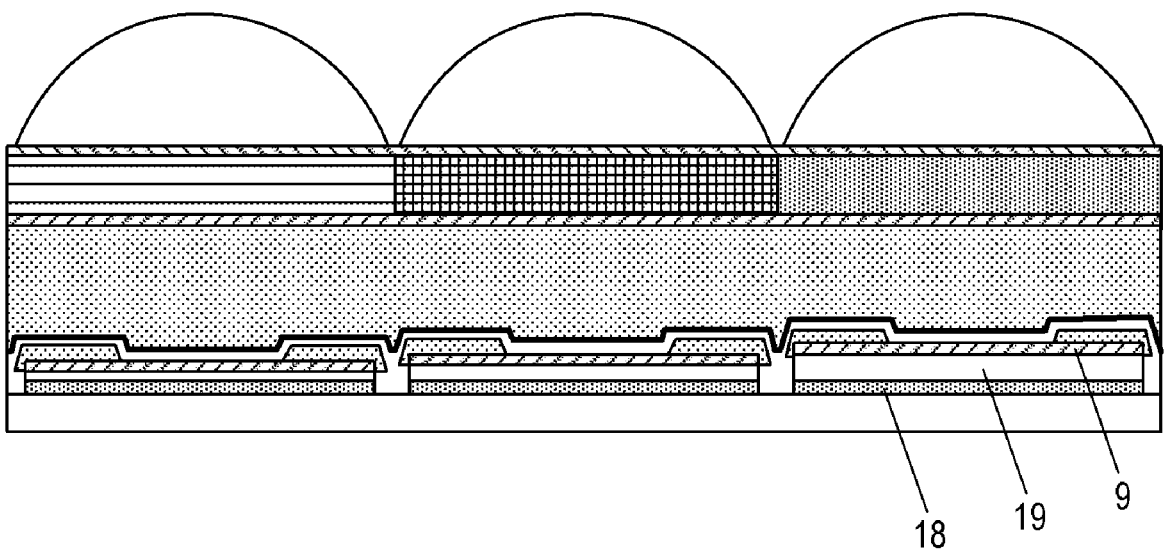
FIG. 13 is a schematic view showing a light-emitting device in accordance with Embodiment 5.

Embodiment 5 of the present invention will be described. In the present embodiment, the distance from the light-emitting part to the color filter 15, in other words, the optical distance until the light emitted from the light-emitting part reaches the color filter 15 is varied among the plurality of light-emitting parts. Embodiment 5 is the same as Embodiment 4 except for this. FIG. 13 is a schematic view showing a light-emitting device 100 in accordance with the present embodiment. FIG. 13 shows a cross section obtained by a plane in the perpendicular direction passing through the apex of the microlens 17 (curved surface portion).

A description will be given to a specific example of the light-emitting device 100 in accordance with the present embodiment. First, aluminum was formed on a substrate 8, and this was patterned, thereby manufacturing a plurality of reflecting layers 18. Then, formation and patterning of an insulation layer formed of silicon oxide were repeated, thereby forming a plurality of insulation films 19 with mutually different layer thicknesses on the plurality of reflecting layers 18, respectively. Specifically, for the portion to be provided with a color filter 15r for transmitting a red light therethrough, the insulation film 19 with a layer thickness of 75 nm was formed; and for the portion to be provided with a color filter 15g for transmitting a green light therethrough, the insulation film 19 with a layer thickness of 130 nm was formed. Then, for the portion to be provided with a color filter 15b for transmitting a blue light therethrough, the insulation film 19 with a layer thickness of 190 nm was formed. Then, formation and patterning of an ITO film were performed, thereby forming a plurality of first electrodes 9 on the plurality of insulation films 19, respectively. Subsequently, a light-emitting device 100 was manufactured in the same manner as in Embodiment 1 (specific example). However, the shape of the opening of the insulation layer 12, in other words the shape of the light-emitting part (as viewed from the perpendicular direction) was set as a circular shape with a radius of 1.5 μm. Further, in the organic layer 10, the layer thickness of the hole transport layer was set at 36 nm, and the layer thickness of the electron transport layer was set at 45 nm. Then, a protective layer 13 was formed so that the upper surface positions (the positions on the color filter 15 side) of the protective layer 13 in the perpendicular direction became uniform. The thickness of the protective layer 13 varies among the plurality of light-emitting parts, and was set at about 1.5 μm as with Embodiment 4.

In the present embodiment, the distance from the light-emitting part to the color filter 15, in other words, the optical distance until the light emitted from the light-emitting part reaches the color filter 15 is set according to the desirable color component (the color component to be extracted to the outside). This can improve the intensity and the color purity of the light emitted in the front surface direction from the light-emitting device 100. Furthermore, it is possible to more improve the current use efficiency of the light-emitting part, and it is possible to more suppress the reduction of the color purity when the light-emitting device 100 is observed from the oblique direction.

Embodiment 6

Embodiment 6 of the present invention will be described. In the present embodiment, a description will be given to the examples where the light-emitting devices 100 in accordance with Embodiments 1 to 5 are applied to various devices.

Figure 14:
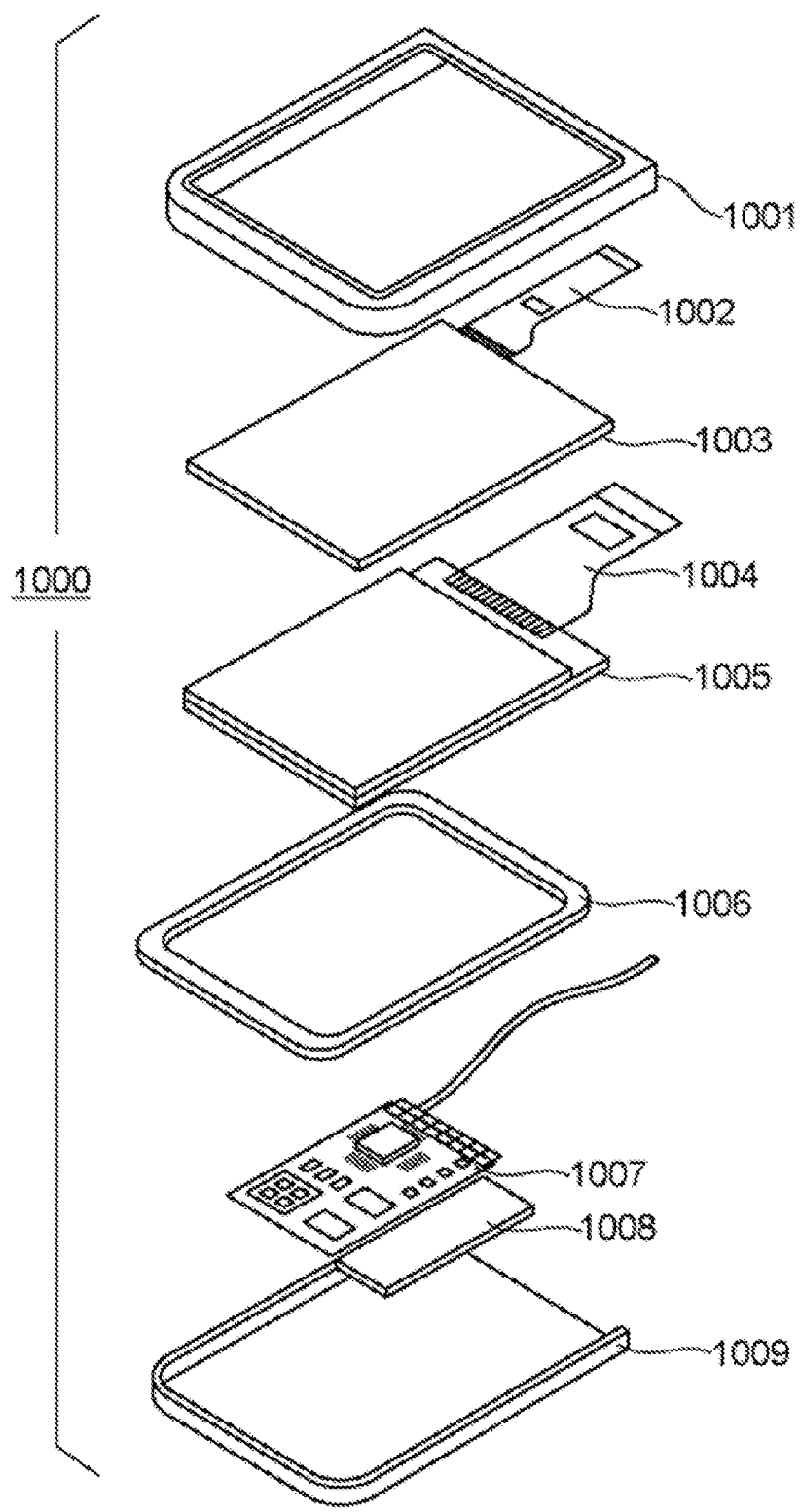
FIG. 14 is a schematic view showing a display device in accordance with Embodiment 6.

FIG. 14 is a schematic view showing a display device 1000 of one example of the display device in accordance with the present embodiment. The display device 1000 may have a touch panel 1003, a display panel 1005, a frame 1006, a circuit substrate 1007, and a battery 1008 between an upper cover 1001 and a lower cover 1009. The display panel 1005 is a display part having any one of the light-emitting devices 100 in accordance with Embodiments 1 to 5, and performs display using the light emitted from the light-emitting device 100. The touch panel 1003 and the display panel 1005 are connected with flexible print circuits FPC 1002 and 1004, respectively. The circuit substrate 1007 includes a control circuit including a transistor printed thereon, and performs various controls such as control of the display panel 1005. The battery 1008 is not required to be provided unless the display device is a portable device, or may be provided at another position even when the display device is a portable device. The display device 1000 may have three kinds of color filters corresponding to a red color, a green color, and a blue color, respectively. A plurality of colors filters may be arranged in a delta array.

The display device 1000 may be used for the display part of a portable terminal. In that case, the display device 1000 may have both of the display function and the operation function. As the portable terminal, mention may be made of a cellular phone such as a smartphone, a tablet, a head mount display, or the like.

The display device 1000 may be used for the display part of an imaging device having an optical part having a plurality of lenses, and an imaging element for receiving the light passed through the optical part. The imaging device may have a display part for displaying the information (such as an image captured by an imaging element) acquired by the imaging element. Further, the display part may be a display part exposed to outside of the imaging device, or may be a display part arranged in a finder. The imaging device may be a digital camera, a digital video camera, or the like.

Figure 15A:
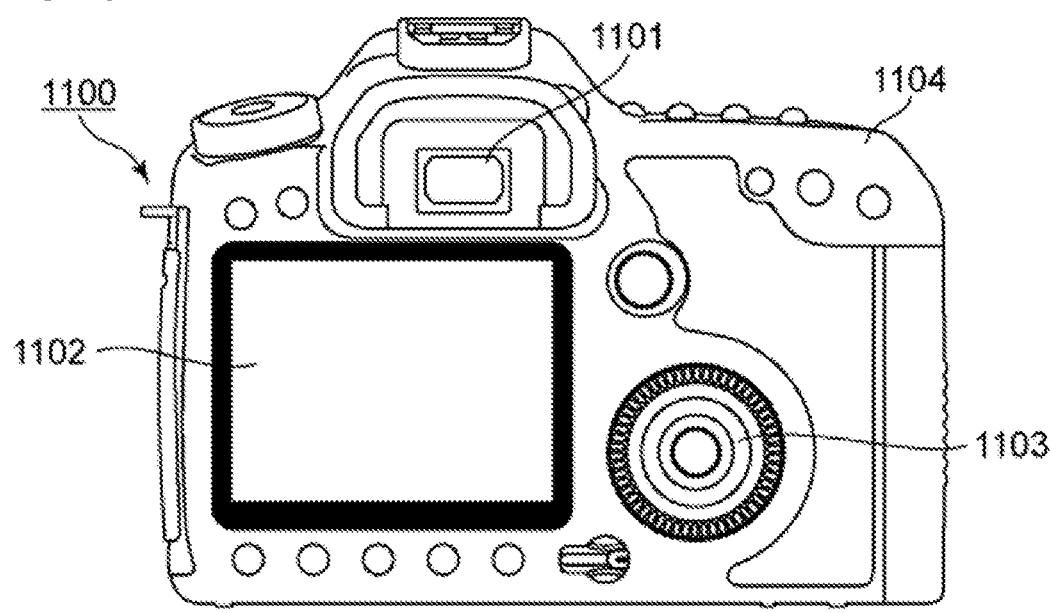
FIG. 15A is a schematic view showing an image device in accordance with Embodiment 6.

FIG. 15A is a schematic view for illustrating an imaging device 1100 of one example of an imaging device in accordance with the present embodiment. The imaging device 1100 may have a view finder 1101, a back-surface display 1102, an operation part 1103, and a housing 1104. The view finder 1101 may have a display device in accordance with the present embodiment (a display device having any one of the light-emitting devices 100 in accordance with Embodiments 1 to 5, and performing display using the light emitted from the light-emitting device 100). In that case, the display device may display not only an image to be imaged but also environment information, imaging instructions, and the like. The environment information may be the intensity of an external light, the direction of an external light, the moving speed of the object, the possibility that the object is shielded by a shield, or the like. The back-surface display 1102 may also have a display device in accordance with the present embodiment.

The preferable timing for imaging is a little time, and hence, information should be displayed as soon as possible. Therefore, a display device using an organic light-emitting element with a high response speed is preferably used. The display device using an organic light-emitting element can be more preferably used in a device required to have a display speed than a liquid crystal display device, or the like.

The imaging device 1100 has an optical part not shown. The optical part has a plurality of lenses, and forms an image of the light on the imaging element accommodated in the housing 1104. The plurality of lenses can adjust the focus by adjusting their respective relative positions. This operation can also be automatically performed. The imaging device 1100 may also be referred as a photoelectric conversion device. The photoelectric conversion device can include the method not performing sequential imaging, but detecting the difference from the previous image, the method in which a part of the recorded image is cut out, or other methods as the imaging methods.

Figure 15B:
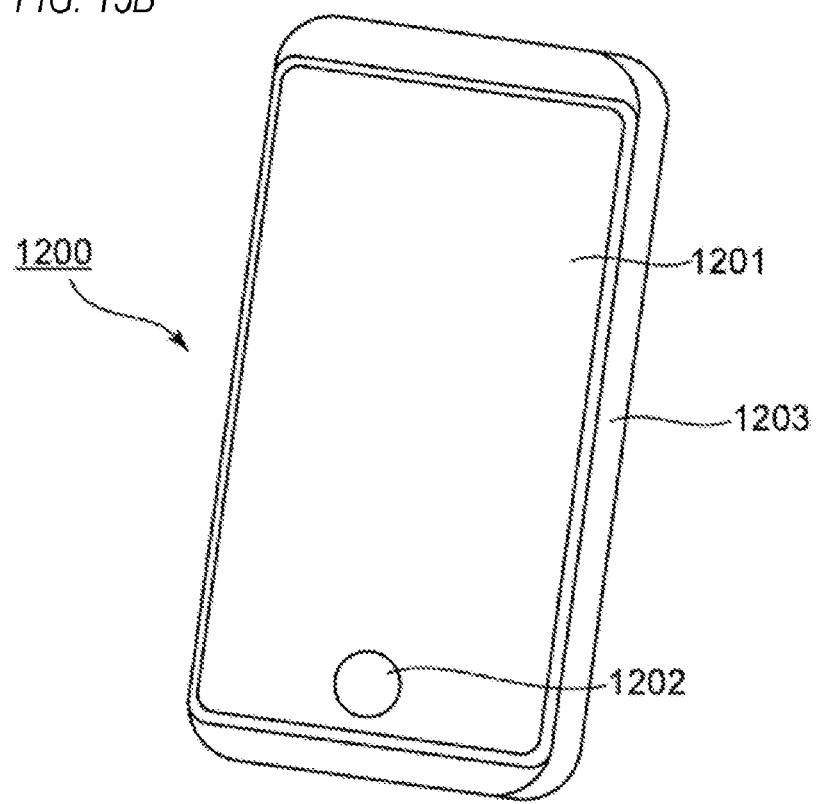
FIG. 15B is a schematic view showing an electronic device in accordance with Embodiment 6.

FIG. 15B is a schematic view showing an electronic device 1200 of one example of an electronic device in accordance with the present embodiment. The electronic device 1200 has a display part 1201, an operation part 1202, and a housing 1203. The display part 1201 has any one of the light-emitting devices 100 in accordance with Embodiments 1 to 5, and performs display using the light emitted from the light-emitting device 100. The electronic device 1200 may have a circuit, a print substrate having the circuit, a battery, and a communication part for communicating with the outside in the housing 1203. The operation part 1202 may be a button, or may be a touch panel system reaction part. The operation part may be a living body recognition part for performing release of the lock, or the like by recognizing the fingerprint. The electronic device having the communication part can also be referred to as a communication device. The electronic device may further have a camera function by including a lens and an imaging element. The image captured by the camera function is projected on the display part. As the electronic device, mention may be made of a smartphone, a note personal computer, or the like.

Figure 16A:
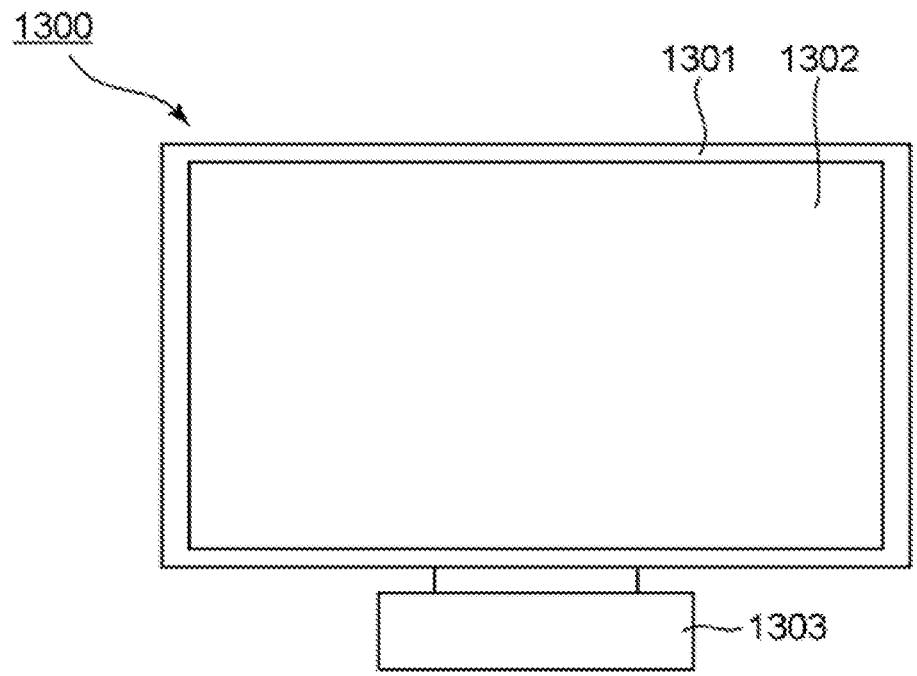
FIGS. 16A and 16B are each a schematic view showing a display device in accordance with Embodiment 6.

FIG. 16A is a schematic view showing a display device 1300 of one example of the display device in accordance with the present embodiment. The display device 1300 is a display device such as a television monitor or a PC monitor. The display device 1300 has a frame 1301, a display part 1302, and a base 1303 for supporting the frame 1301 and the display part 1302. The display part 1302 has any one of the light-emitting devices 100 in accordance with Embodiments 1 to 5, and performs display using the light emitted from the light-emitting device 100. The form of the base 1303 is not limited to the form of FIG. 16A. The lower side of the frame 1301 may also serve as the base 1303. Alternatively, the frame 1301 and the display part 1302 may be bent. The curvature radius may be not less than 5000 mm and not more than 6000 mm.

Figure 16B:
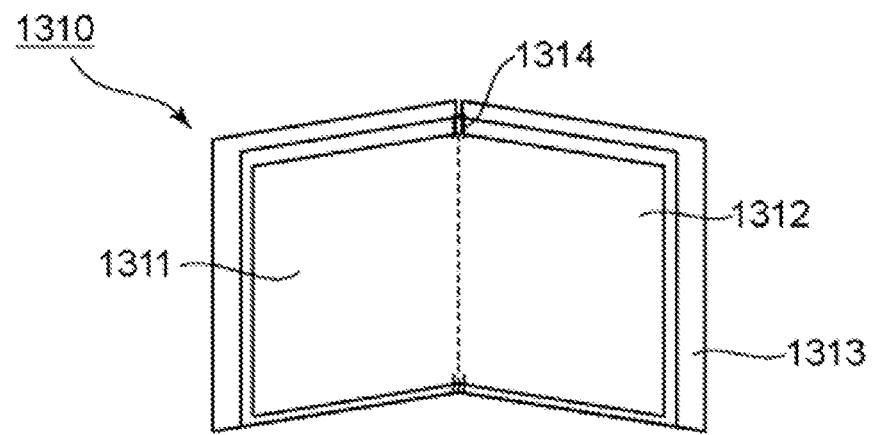

FIG. 16B is a schematic view showing a display device 1310 of one example of another display device in accordance with the present embodiment. The display device 1310 is a so-called foldable display device configured bendably. The display device 1310 has a first display part 1311, a second display part 1312, a housing 1313, and a bending point 1314. Each of the first display part 1311 and the second display part 1312 has any one of the light-emitting devices 100 in accordance with Embodiments 1 to 5, and performs display using the light emitted from the light-emitting device 100. The first display part 1311 and the second display part 1312 may be one display device without a juncture. The first display part 1311 and the second display part 1312 can be separated from each other at the bending point. The first display part 1311 and the second display part 1312 may display different images, respectively, or the first display part 1311 and the second display part 1312 may display one image.

Figure 17A:
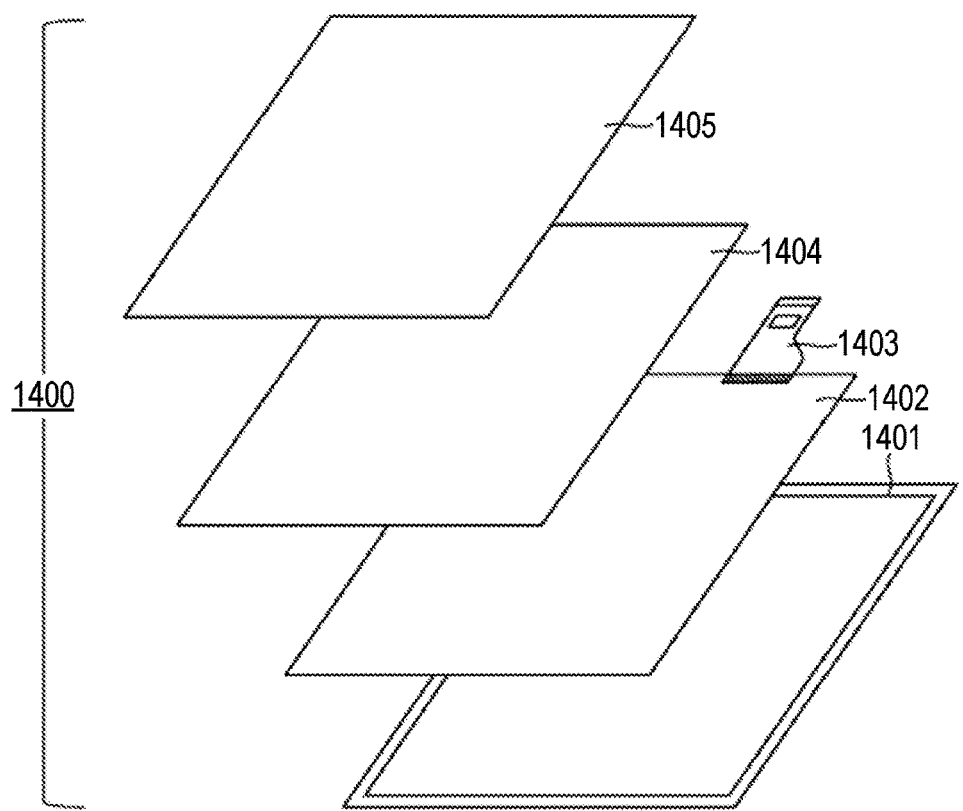
FIG. 17A is a schematic view showing an illuminating device in accordance with Embodiment 6.

FIG. 17A is a schematic view showing an illuminating device 1400 of one example of an illuminating device in accordance with the present embodiment. The illuminating device 1400 may have a housing 1401, a light source 1402, a circuit substrate 1403, an optical film 1404, and an optical diffusion part 1405. The light source 1402 has any one of the light-emitting devices 100 in accordance with Embodiments 1 to 5. The optical film 1404 may be a filter (optical filter) for improving the color rendering properties of the light source 1402. The optical diffusion part 1405 can effectively diffuse the light from the light source 1402, and can deliver the light to the wide range as with illumination or the like. The optical film 1404 and the optical diffusion part 1405 may be provided on the light-emitting side of the illuminating device 1400. If required, a cover may be provided on the outermost side.

The illuminating device 1400 is a device for illuminating, for example, the interior of a room. The illuminating device 1400 may emit light of a white color, a natural white color, or other colors (any color of from a blue color to a red color). The white color is a color with a color temperature of 4200 K, and the natural white is a color with a color temperature of 5000 K. The illuminating device 1400 may have a dimmer circuit for modulating the luminescent color of the illuminating device 1400. The illuminating device 1400 may have a power supply circuit to be connected with the light source 1402. The power supply circuit is a circuit for converting an alternating voltage into a direct current voltage. Further, the illuminating device 1400 may have a color filter. Further, the illuminating device 1400 may have a heat radiation part. The heat radiation part radiates the heat in the device to outside the device, and mention may be made of a metal with a high specific heat, liquid silicon, or the like.

Figure 17B:
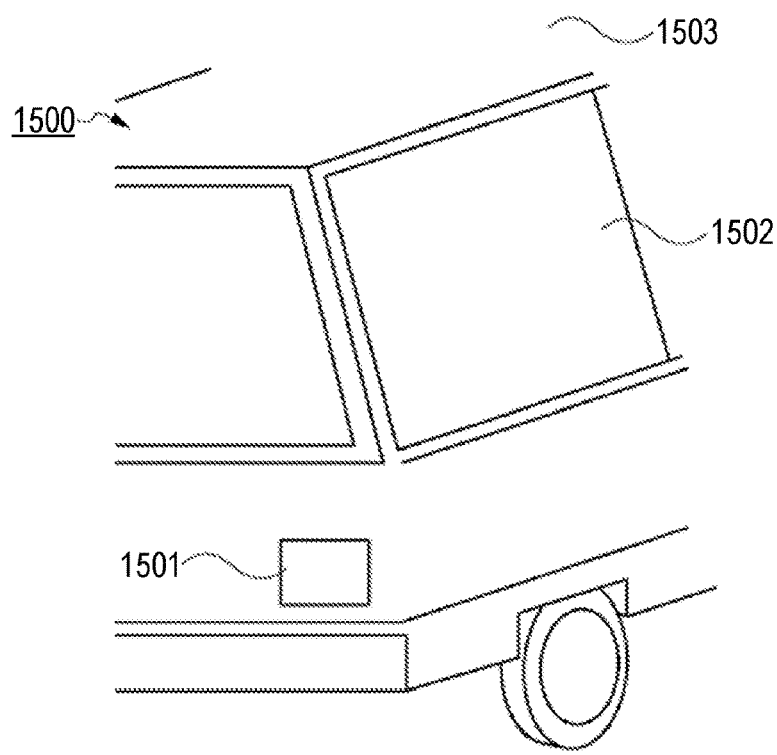
FIG. 17B is a schematic view showing a mobile body in accordance with Embodiment 6.

FIG. 17B is a schematic view showing an automobile 1500 of one example of the mobile body in accordance with the present embodiment. The automobile 1500 may have a table lamp 1501 of one example of a lighting appliance. The table lamp 1501 lights up according to the braking operation, or the like.

The table lamp 1501 has any one of the light-emitting devices 100 in accordance with Embodiments 1 to 5. The table lamp 1501 may have a protective member for protecting the light-emitting device 100. The material for the protective member does not matter so long as it has a somewhat high strength, and is transparent. However, the protective member preferably includes polycarbonate or the like. Polycarbonate may be mixed with a furandicarboxylic acid derivative, an acrylonitrile derivative, or the like.

The automobile 1500 may have a car body 1503 and a window 1502 mounted on the car body 1503. The window 1502 may be a transparent display unless it is a window for checking ahead and behind the automobile 1500. The transparent display may have any one of the light-emitting devices 100 in accordance with Embodiments 1 to 5. In this case, the constituent material such as the electrode included in the light-emitting device 100 includes a transparent member.

The mobile body in accordance with the present embodiment may be a ship, an aircraft, a drone, or the like. The mobile body may have an airframe and a lighting appliance provided on the airframe. The lighting appliance may emit light for indicating the position of the airframe. The lighting appliance has any one of the light-emitting devices 100 in accordance with Embodiment 1 to 5.

The display device in accordance with the present embodiment (the display device having any one of the light-emitting devices 100 in accordance with Embodiments 1 to 5, and for performing display using the light emitted from the light-emitting device 100) is also applicable to a wearable device such as smartglasses, a HMD, or a smart contact lens. The display device in accordance with the present embodiment is also applicable to a system having a wearable device, or the like. The imaging display device used as a wearable device, or the like has an imaging device capable of photoelectric conversion of a visible light, and a display device capable of emitting a visible light.

Figure 18A:
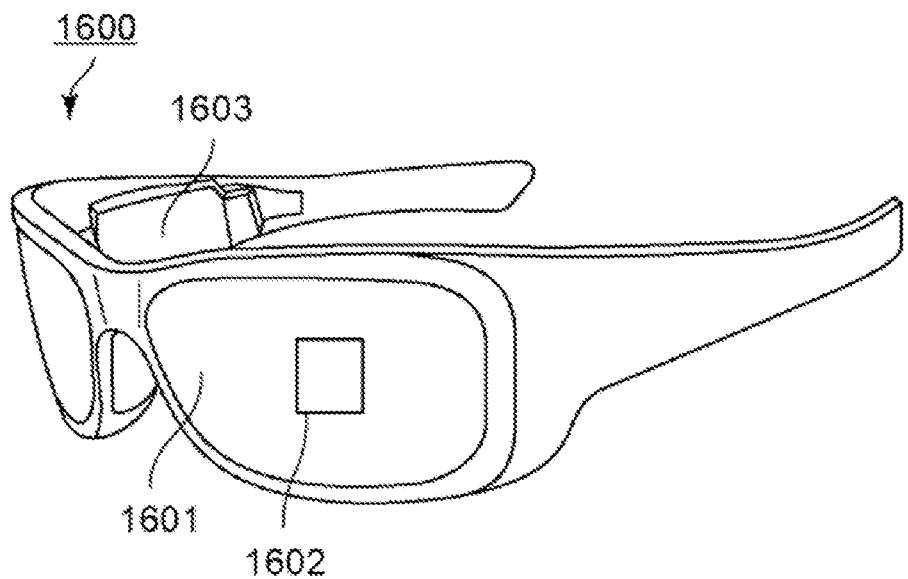
FIGS. 18A and 18B are each a schematic view showing a wearable device in accordance with Embodiment 6.

FIG. 18A is a schematic view showing glasses 1600 (smartglasses) of one example of the wearable device in accordance with the present embodiment. An imaging device 1602 such as a CMOS sensor or a SPAD is provided on the front surface side of the lens 1601 of the glasses 1600. Further, the display device in accordance with the present embodiment (the display device having any one of the light-emitting devices 100 in accordance with Embodiments 1 to 5, and performing display using the light emitted from the light-emitting device 100) is provided on the back surface side of the lens 1601.

The glasses 1600 further have a control device 1603. The control device 1603 functions as a power supply for supplying an electric power to the imaging device 1602 and the display device. Further, the control device 1603 controls the operations of the imaging device 1602 and the display device. In the lens 1601, an optical system for condensing light onto the imaging device 1602 is formed.

Figure 18B:
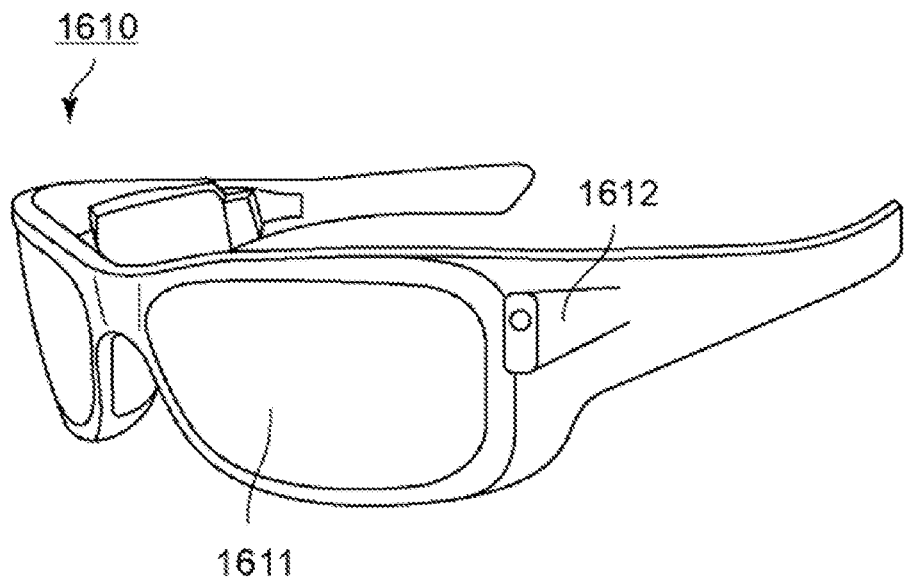

FIG. 18B is a schematic view showing glasses 1610 (smartglasses) of one example of the wearable device in accordance with the present embodiment. The glasses 1610 has a control device 1612. On the control device 1612, an imaging device corresponding to the imaging device 1602, and the display device in accordance with the present embodiment are mounted. In the lens 1611, the imaging device in the control device 1612 and an optical system for projecting the light emitted from the display device are formed, and an image is projected on the lens 1611. The control device 1612 functions as a power supply for supplying an electric power to the imaging device and the display device, and controls the operations of the imaging device and the display device.

The control device may have a visual line detecting part for detecting the visual line of a wearer of the glasses 1610. For detection of the visual line, infrared rays may be used. The infrared light-emitting part emits an infrared light with respect to the eyeball of a user carefully watching the display image. The reflected light from the eyeball of the emitted infrared light is detected by the imaging part having a photo acceptance unit, resulting in the captured image of the eyeball. The inclusion of a reducing part for reducing the light from the infrared light-emitting part to the display part in a plan view can reduce the quality degradation of the image projected from the display device onto the lens 1611. The visual line of a user with respect to the display image is detected from the captured image of the eyeball obtained by imaging of an infrared light. To detection of the visual line using the captured image of an eyeball, a known method is applicable. As one example, a visual line detecting method based on the Purkinje image due to the reflection of the irradiation light at the cornea can be used. More specifically, visual line detection processing based on the pupil-corneal reflection method is performed. Using the pupil-corneal reflection method, based on the image of the pupil included in the captured image of the eyeball, and the Purkinje image, the visual line vector indicating the direction (rotation angle) of the eyeball is calculated, thereby detecting the visual line of a user.

Incidentally, when display control is performed based on visual recognition detection (visual line detection), the light-emitting devices 100 in accordance with Embodiments 1 to 5 are preferably applicable to smartglasses having an imaging device for imaging the outside. The smartglasses can display the captured external information on a real-time basis.

Incidentally, the display device in accordance with the present embodiment (the display device having any one of the light-emitting devices 100 in accordance with Embodiments 1 to 5, and performing display using the light emitted from the light-emitting device 100) has an imaging device having a photo acceptance unit, and may control the display image based on the visual line information of a user from the imaging device. Specifically, based on the visual line information, a first viewing region carefully watched by a user, and a second viewing region other than the first viewing region are determined. The first viewing region and the second viewing region may be determined by the control device of the display device, or those determined by an external control device may be received by the display device. In the display region of the display device, the display resolution of the first viewing region may be controlled higher than the display resolution of the second viewing region. In other words, the resolution of the second viewing region may be set lower than that of the second viewing region.

Alternatively, the following is also acceptable: the display region has a first display region and a second display region different from the first display region, and a region with a higher priority is determined from the first display region and the second display region based on the visual line information. The first display region and the second display region may be determined by the control device of the display device, or the one determined by an external control device may be received by the display device. The resolution of the region with a high priority may be set higher than the resolution of the region other than the region with a high priority. In other words, the resolution of the region with a relatively lower priority may be reduced.

Incidentally, for the determination of the first viewing region and the region with a high priority, AI may be used. AI may be a model configured such that with the image of the eyeball, and the direction in which the eyeball of the image has actually watched as the teaching data, the angle of the visual line, and the distance to the object beyond the visual line are estimated from the image of the eyeball. The AI program may be included in the display device, may be included in the imaging device, or may be included in an external device. When an external device has the AI program, the information is transmitted to the display device via communication.

As described up to this point, the light-emitting devices 100 in accordance with Embodiments 1 to 5 are used for various devices. As a result, it is possible to perform display with a good image quality, and it is possible to perform favorable light emission.

In accordance with the present invention, light with a high color purity can be extracted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-180532, filed on Oct. 28, 2020, which is hereby incorporated by reference herein in its entirety.

What is claimed is:

1. A light-emitting device comprising:
a substrate;
a lens provided above a main surface of the substrate; and
a light-emitting part provided between the main surface of the substrate and the lens,
wherein the lens has a convex curved surface portion on an opposite side to the substrate,
wherein in a first direction perpendicular to the main surface of the substrate, the light-emitting part is provided at a position more distant from the lens than a curvature center of the curved surface portion, wherein when an apex of the curved surface portion in the first direction is referred to as a first position, and an end of the curved surface portion in a second direction in parallel with the substrate is referred to as a second position, and h represents a distance from the first position to the second position in the first direction, and r represents a distance from the first position to the second position in the second direction, h/r<0.95 is satisfied, and wherein 0.4<d/R<1 is satisfied where d represents a distance in the first direction from the light-emitting part to the curvature center of the curved surface portion, and R represents a curvature radius of the curved surface portion.

2. The light-emitting device according to claim 1, wherein h/r<0.9 is satisfied.

3. The light-emitting device according to claim 1, wherein h/r<0.5 is satisfied.

4. The light-emitting device according to claim 1, wherein r/R<0.97 is satisfied.

5. The light-emitting device according to claim 1, wherein when n1 represents a refractive index of the lens, n2 represents a refractive index from the light-emitting part to the lens, and H represents a distance in the first direction from the first position to the light-emitting part, $$\frac{n_1 \times H^2}{\{n_1 \times h + n_2 \times (H-h)\} \times R} > 1 \qquad \text{[Math. 1]}$$

is satisfied.

6. The light-emitting device according to claim 5, wherein the refractive index n2 is not less than 1.6 and not more than 2.0.

7. The light-emitting device according to claim 1, wherein when n1 represents a refractive index of the lens, n2 represents a refractive index from the light-emitting part to the lens, and H represents a distance in the first direction from the first position to the light-emitting part, $$n_1 \times \left(\frac{n_1 \times H}{n_2} - R\right) \times R^{-1} \times r \times \left\{r^2 + \left(\frac{n_1 \times H}{n_2} - h\right)^2\right\}^{-1/2} < 1 \qquad \text{[Math. 2]}$$

is satisfied.

8. The light-emitting device according to claim 1, wherein when n1 represents a refractive index of the lens, and a represents a distance in the second direction from the first position to an end of the light-emitting part, a<R/n1 is satisfied.

9. The light-emitting device according to claim 8, wherein a/(R/n1)≤0.85 is satisfied.

10. The light-emitting device according to claim 1, further comprising:
a first electrode provided on the substrate; and
a second electrode provided on the light-emitting part,
wherein the light-emitting part emits light due to a potential difference between the first electrode and the second electrode.

11. The light-emitting device according to claim 10, comprising:
a plurality of first electrodes;
an insulation layer provided in contact with respective ends of the plurality of first electrodes; and
an organic layer covering the plurality of first electrodes, and including a plurality of light-emitting parts,
wherein the insulation layer has a plurality of opening parts so as to expose the plurality of first electrodes respectively, and
wherein at the opening part, the first electrode and the organic layer are in contact with each other.

12. A display device comprising:
a display part including the light-emitting device according to claim 1; and
a control circuit configured to control the display part.

13. An imaging device comprising:
an optical part;
an imaging element configured to receive light passed through the optical part; and
a display part configured to display an image captured by the imaging element,
wherein the display part includes the light-emitting device according to claim 1.

14. An electronic device comprising:
a display part including the light-emitting device according to claim 1;
a housing provided with the display part; and
a communication part provided in the housing, and configured to communicate with outside.

* * * * *